United States Patent
Eliash et al.

(10) Patent No.: US 11,114,178 B1
(45) Date of Patent: Sep. 7, 2021

(54) PHYSICAL DEFECT DETECTION IN AN INTEGRATED MEMORY ASSEMBLY

(71) Applicant: Western Digital Technologies, Inc., San Jose, CA (US)

(72) Inventors: Tomer Eliash, Sunnyvale, CA (US); Yu-Chung Lien, San Jose, CA (US); Alexander Bazarsky, Holon (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/897,724

(22) Filed: Jun. 10, 2020

(51) Int. Cl.
| | |
|---|---|
| *G11C 11/56* | (2006.01) |
| *G11C 29/02* | (2006.01) |
| *G11C 29/12* | (2006.01) |
| *G11C 16/10* | (2006.01) |
| *G11C 29/44* | (2006.01) |

(52) U.S. Cl.
CPC ............ *G11C 29/021* (2013.01); *G11C 16/10* (2013.01); *G11C 29/12005* (2013.01); *G11C 29/44* (2013.01); *G11C 2029/1202* (2013.01); *G11C 2029/1204* (2013.01)

(58) Field of Classification Search
CPC . G11C 29/021; G11C 16/10; G11C 29/12005; G11C 29/44
USPC ....................................................... 365/201
See application file for complete search history.

(56) References Cited

U.S. PATENT DOCUMENTS

| | | | |
|---|---|---|---|
| 7,532,513 B2 | 5/2009 | Chen et al. | |
| 7,660,162 B2 | 2/2010 | Cho | |
| 8,514,630 B2 | 8/2013 | Huynh et al. | |
| 9,159,452 B2* | 10/2015 | Yamada | G11C 29/025 |
| 9,164,526 B2 | 10/2015 | Pan et al. | |
| 9,224,501 B2* | 12/2015 | Kong | G11C 29/44 |
| 9,293,173 B2 | 3/2016 | Lee et al. | |
| 9,679,616 B2 | 6/2017 | Grunzke | |
| 9,715,924 B2 | 7/2017 | Mokhlesi et al. | |
| 2010/0125429 A1* | 5/2010 | Yamada | G11C 7/1006 702/64 |
| 2014/0269109 A1* | 9/2014 | Kong | G11C 29/44 365/189.07 |
| 2017/0117035 A1* | 4/2017 | Mokhlesi | G11C 16/0483 |
| 2017/0256955 A1 | 9/2017 | Addepalli et al. | |

* cited by examiner

*Primary Examiner* — Xiaochun L Chen
(74) *Attorney, Agent, or Firm* — Vierra Magen Marcus LLP

(57) ABSTRACT

Technology for physical defect detection in an integrated memory assembly having a control semiconductor die and a memory semiconductor die is disclosed. The control die compares actual current usage during a memory operation (such as a program operation) with expected current usage. In the event that the actual current usage deviates from the expected current usage by more than a threshold, a region of the memory structure is suspected as having a physical defect. For example, the selected word that is connected to the memory cells that were programmed may be suspected as having a physical defect. If a region is suspected as having a physical defect, a data integrity check may be performed in that region. If the data integrity check fails, the region may be marked as ineligible to store data.

20 Claims, 26 Drawing Sheets

PHYSICAL DEFECT DETECTION IN AN INTEGRATED MEMORY ASSEMBLY

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Non-volatile semiconductor memory devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the non-volatile memory cells, it is typical to use read reference voltages in order to determine what data state a memory cell is presently in.

In some memory systems, user data is programmed into non-volatile memory cells by applying one or more program pulses to the memory cells, and then verifying whether the memory cells have been programmed to their intended data state. In some architectures, the memory cells are connected to word lines. The program pulses may be applied to a selected word line in order to program selected memory cells that are connected to the selected word line. Herein, a "selected word line" means a word line that is connected to memory cells for which a program, read, or verify operation is performed.

It is possible for the programming process to complete with a status of success even of some of the memory cells are not in fact programmed to their intended data state. This is because error correction algorithms may be used to correct errors in the data. An error correction code (ECC) encoder may generate parity bits based on the user data. The parity bits are stored in the non-volatile memory cells. An ECC codeword (or more briefly "codeword") that contains the user data and the parity bits is stored in the memory cells. An ECC decoder may be used to run an ECC algorithm to detect and correct errors in the data.

It is possible for the memory system to have physical defects. Such physical defects include, but are not limited to, broken word lines, word line to word line shorts, bit line to bit line shorts, etc. Such physical defects impact the ability to properly operate the memory system. Physical defects could be present when the memory system is manufactured, or may develop (or worsen) over time.

DETAILED DESCRIPTION

Figure 1A:
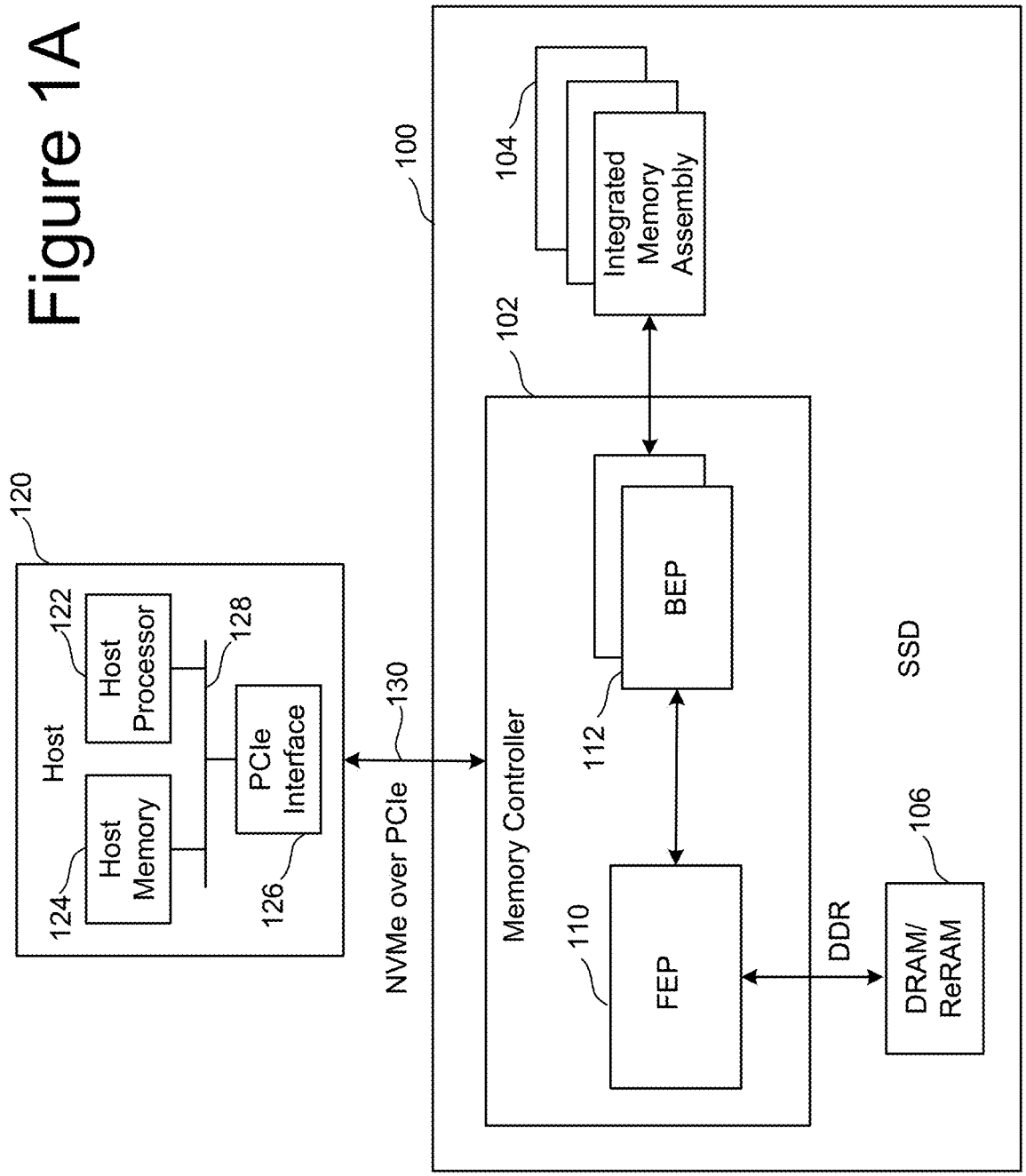
FIG. 1A is a block diagram of one embodiment of a memory system connected to a host.

The present technology will now be described with reference to the figures, which in embodiments, relate to physical defect detection in an integrated memory assembly having a control semiconductor die and a memory semiconductor die. The memory semiconductor die (or "memory die") contains a memory structure having non-volatile memory cells. The control semiconductor die (or "control die") contains control circuits that control memory operations in the memory dies. In one embodiment, the integrated memory assembly has a stack of the control dies and memory dies. In some embodiment, the control dies and memory dies are affixed to each other by, for example, bond pads.

In some embodiments, the control die compares actual current usage during a memory operation (such as a program operation) with expected current usage. In an embodiment, in the event that the actual current usage deviates from the expected current usage by more than a threshold, the control die determines that a region of the memory structure is suspected as having a physical defect. For example, the selected word that is connected to the memory cells that were programmed may be suspected as having a physical defect.

In some embodiments, once a region is suspected as having a physical defect, a data integrity check is performed in that region. Note that even if the region has a physical defect, a programming operation can still pass. This is due, in part, to the fact that the program operation can complete successfully even if not every memory cell is programmed to its intended data state. The data integrity check may read data that was successfully programmed, and determine a bit error rate (BER) of the data that was read. If the BER is too high, then additional mitigation steps may be taken such as marking the region as ineligible to store data. Also, the data is stored elsewhere since the region is now ineligible to store data.

In some memory systems, such data integrity checks are routinely performed after a successful program operation. However, such routine data integrity checks impair performance due to the time spent reading and decoding the data. In some embodiments, if it is determined that the region is not suspected as having a physical defect, a data integrity check is not performed, which avoids the aforementioned performance reduction.

In some memory systems, to reduce the chance of a physical defect causing a data loss, additional redundancy data is stored somewhere in the memory system. For example, a RAID system may store XOR information of the programmed data. Then, if the memory system is unable to decode data that was read from memory cells that were successfully programmed, the XOR information can be accessed to recover the data. However, the XOR information reduces storage capacity. By embodiments of a memory system checking for physical defects while data is being programmed, the need for XOR information is reduced or eliminated.

In some memory systems, to reduce the chance of a physical defect causing a data loss, word lines that are more likely to have physical defects are not programmed. However, this reduces storage capacity of the memory system. By embodiments of a memory system checking for physical defects while data is being programmed, word lines that are more likely to have physical defects can be programmed, thereby avoiding the aforementioned reduction in storage capacity.

Also, no information needs to be transferred over a data bus between the integrated memory assembly and a memory controller to determine if a region is suspected as having a physical defect. In some embodiments, the check for the physical defect is based on multiple measurements of current usage during a memory operation (e.g., a program operation). By the control die checking for the physical defect by comparing the measurements of current usage with expected current usage, none of the measurements need to be transferred to the memory controller. In some embodiments, the memory controller communicates with the control die over an ONFI data bus. Hence, communication over the ONFI data bus is not negatively impacted in embodiments in which the control die checks for physical defects based on current measurements.

In some embodiments, the control die and the memory die are bonded together with many bond pads that permit communication between the control die and the memory die. In one embodiment, the control die provides voltages through the bond pads to the memory structure in order to control memory operations. For example, the control die may provide a program voltage to a selected word line, by transferring the program voltage through one of the bond pads. Voltages may also be provided to other (unselected) word lines through other bond pads. In one embodiment, the control die is able to access data from the memory die through the bond pads. In one embodiment, each data bit and each parity bit of a codeword is read by way of a different bond pads. This, in effect, provides an interface that is much wider than a data bus between the integrated memory assembly and the memory controller. Therefore, transferring the codewords from the memory die to the control die is very efficient. Likewise, when programming memory cells the data bits may be provided to bit lines by way of the bond pads.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die. Hence, the control die is suited to perform operations such as determining whether there is a physical defect based on current measurements.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

FIG. 1A-FIG. 3 describe one example of a memory system that can be used to implement the technology disclosed herein.

FIG. 1A is a block diagram of one embodiment of a memory system 100 connected to a host 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, integrated memory assembly 104, memory system 100, memory controller 102, or the combination of memory system 100 and host 120.

In one embodiment, there are a plurality of integrated memory assemblies 104. In an embodiment, each integrated memory assembly 104 includes one or more memory die and one or more control die. Each memory die may include one or more memory structures. A control die controls operation of a memory die. For example, a control die may control read, write, and erase operations on a memory die. In one embodiment, the memory controller 102 communicates with a control die in order to instruct the control die to perform read, write, or erase operations on one or more non-volatile memory die or one or more memory structures. In one embodiment, each memory die in the integrated memory assembly 104 utilize NAND flash memory (including two dimensional NAND flash memory and/or three dimensional NAND flash memory). In other embodiments, the integrated memory assembly 104 can include other types of memory; for example, the memory package can include PCM memory.

Memory controller 102 communicates with host 120 using an interface 130 that implements NVM Express (NVMe) over PCI Express (PCIe). For working with memory system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
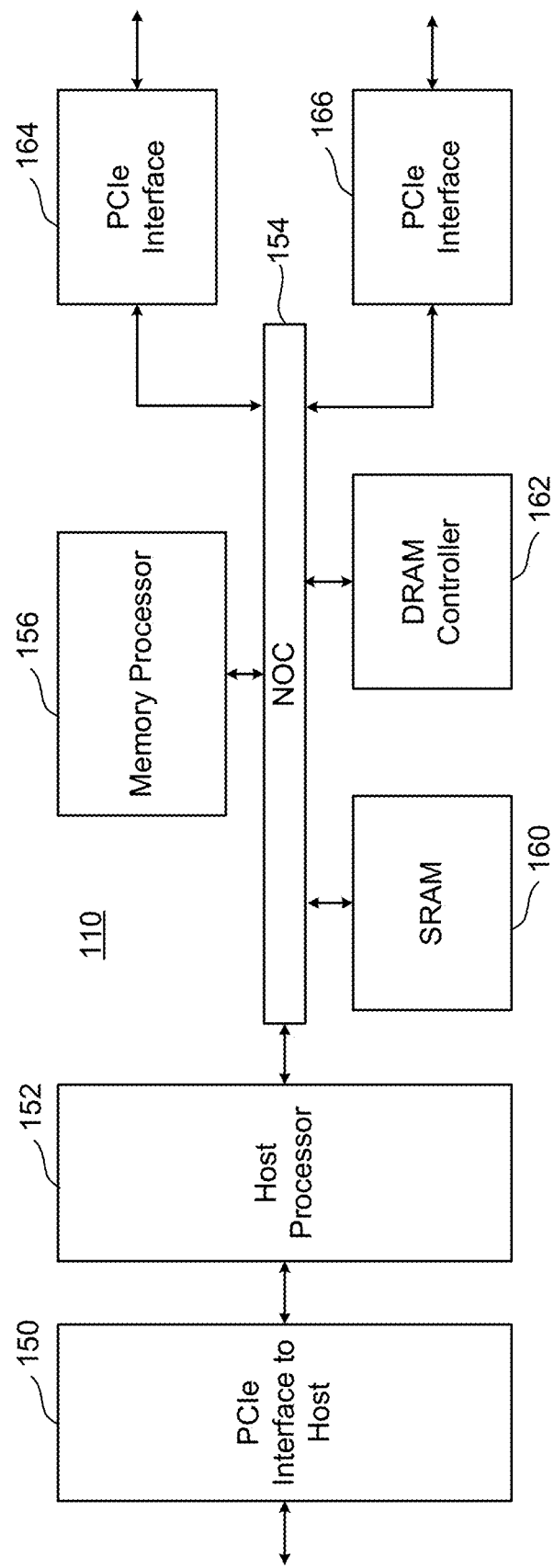
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2:
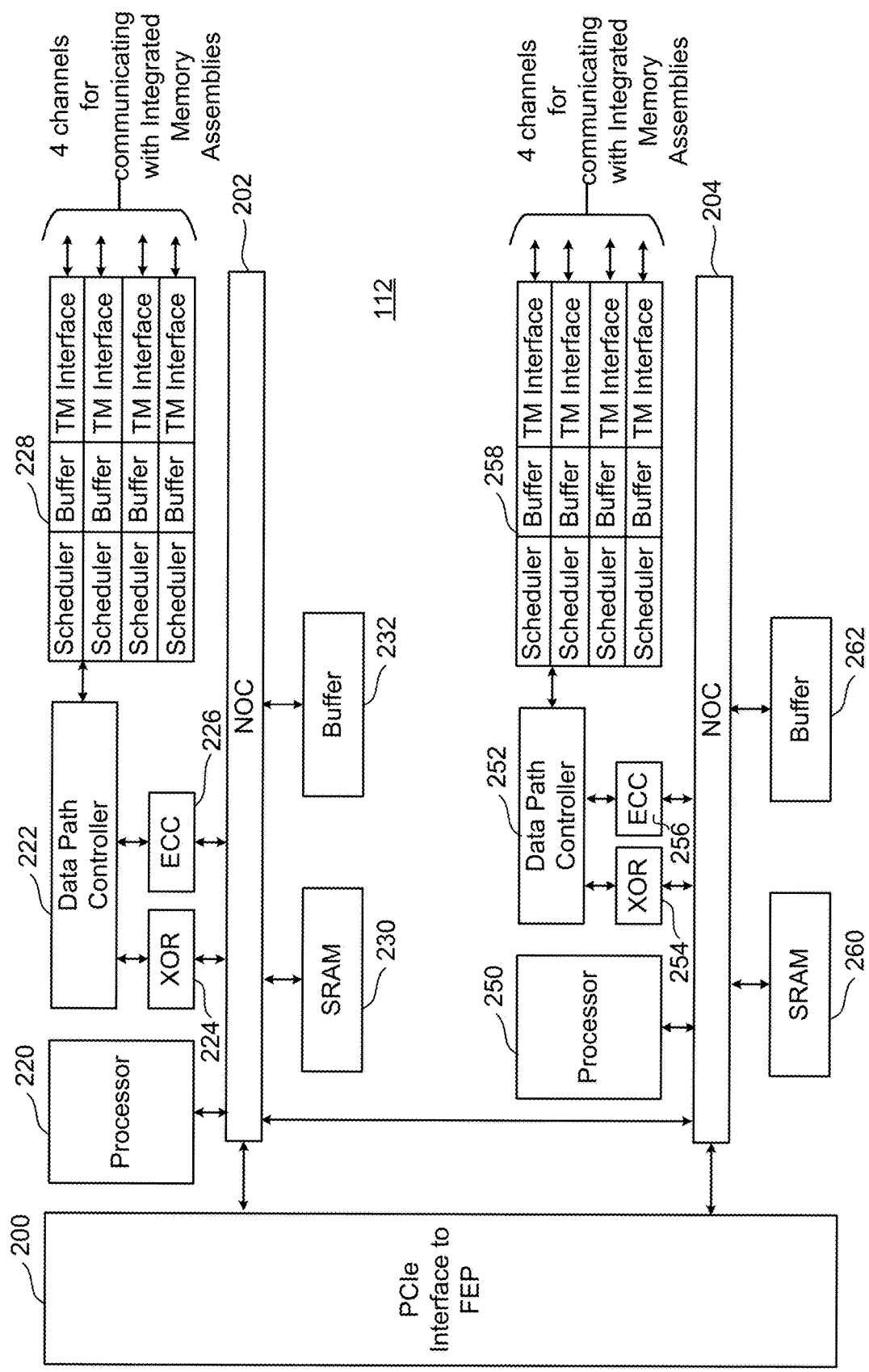
FIG. 2 is a block diagram of one embodiment of a Back End Processor Circuit.

FIG. 2 is a block diagram of one embodiment of the BEP circuit 112. FIG. 2 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2. Additionally, controllers with structures different than FIGS. 1B and 2 can also be used with the technology described herein.

Figure 3:
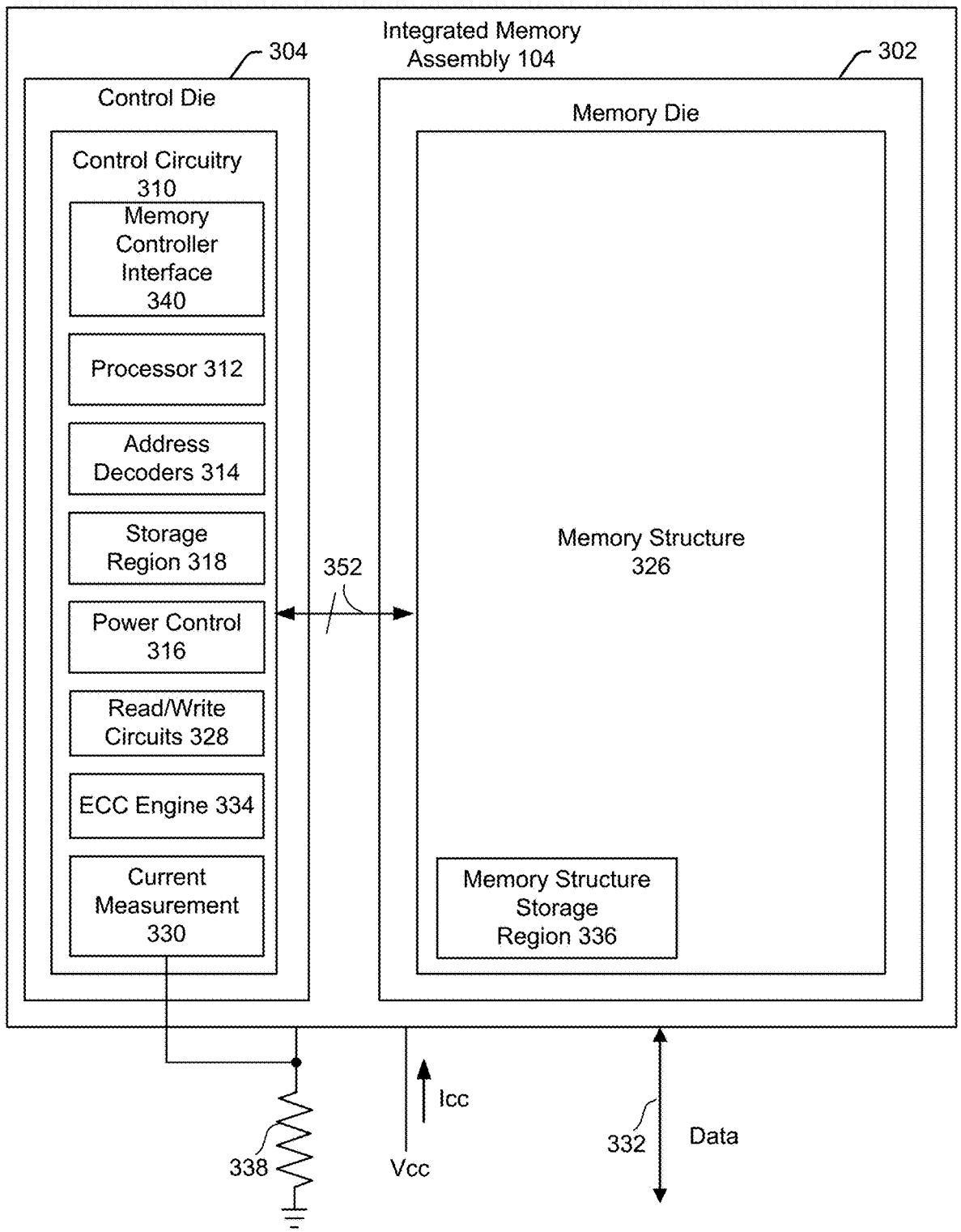
FIG. 3 is a functional block diagram of an embodiment of an integrated memory assembly.

FIG. 3 is a functional block diagram of one embodiment of an integrated memory assembly 104. In one embodiment, the integrated memory assembly 104 includes two types of semiconductor die (or more succinctly, "die"). One type is referred to herein as a control die 304, the other type is referred to herein as a memory die 302. Memory die 302 includes memory structure 326. Memory structure 326 may contain non-volatile memory cells. Control die 304 includes control circuitry 310. In some embodiments, the memory die 302 and the control die 304 are bonded together, as will be described in more detail below. Typically, there are multiple control dies 304 and multiple memory dies 302 in an integrated memory assembly 104.

The control circuitry 310 performs memory operations (e.g., write, read, erase and others) on memory structure 326. The control circuitry 310 includes processor 312, an on-chip address decoders 314, a power control circuit 316, a storage region 318, read/write circuits 328, current measurement 330, memory controller interface 340, and an ECC engine 334. In another embodiment, a portion of the read/write circuits 328 are located on control die 304, and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage. Herein, the term, "control die," "control semiconductor die," or the like, means a semiconductor die that contains control circuitry for performing memory operations on non-volatile memory cells on a memory die. The control die 304 is connected to the memory die 302 that it controls. The connection may be a direction connection or an indirect connection. Typically, numerous semiconductor die 304 are formed from a single semiconductor (e.g., silicon) wafer. Typically, numerous memory die 302 are formed from a single semiconductor (e.g., silicon) wafer.

The processor 312 is programmable and reprogrammable. The processor 312 may be a microprocessor. In one embodiment, the processor has a reduced instruction set computer (RISC) architecture. The processor 312 executes program instructions in order to control the memory die 302. The processor 312 controls operation of address decoders 314, power control 316, and read/write circuits 328. Thus, processor 312 is able to control memory operations in the memory structure 326. In some embodiments, the processor 312 executes instructions in order to regulate power and/or current usage of the integrated memory assembly 104. In some embodiments, processor 312 is replaced with a hard-wired state machine. Thus, a hard-wired state machine may be used to control operation of address decoders 314, power control 316, read/write circuits 328, current measurement 330, and/or ECC engine 334, and hence control memory operations in the memory structure 326. In some embodiments, the control die 304 has both a hard-wired state machine and a processor (e.g., microprocessor).

The storage region 318 may be used to store the program instructions that are executed on the processor 312. The storage region 318 may be used to store various parameters and settings that are used to control the memory die 302. For example, the parameters and settings could include voltage levels of signals applied to the memory structure 326. The storage region 318 could contain either volatile memory (e.g., SRAM, DRAM) or non-volatile memory.

The memory structure 326 also has a memory structure storage region 336 to store program instructions that are executed on the processor 312. The memory structure storage region 336 may be used to store various parameters and settings that are used to control the memory die 302. In some embodiments, the control die 304 transfers program instructions, parameters, settings, and the like from memory structure storage region 336 to storage region 318 when the integrated memory assembly 104 is initialized (e.g., booted). In an embodiment, the control die 304 has hardware (e.g., a hard-wired state machine) to control the transfer from memory structure storage region 336 to storage region 318. The memory structure storage region 336 may be implemented in non-volatile memory cells that are not used to store user data.

Each memory structure 326 is addressable by word lines via a row decoder (not depicted in FIG. 3) and by bit lines via a column decoder, in some embodiments. The on-chip address decoder 314 provides an address interface between addresses used by host 120 or memory controller 102 to the hardware address used by row decoders and column decoders (not expressly depicted in FIG. 3). Power control circuit 316 controls the power and voltages supplied to the word lines, bit lines, and select lines during memory operations.

Power control circuit 316 may include voltage generators (e.g., charge pumps) for generating voltages. The power control circuit 316 executes under control of the processor 312.

The read/write circuits 328 includes sense blocks (which may contain sense amplifies (SA)), in some embodiments. The sense amplifies include bit line drivers, in some embodiments. The read/write circuits 328 executes under control of the processor 312.

Data bus 332 allows data to be transferred between the memory controller 102 and the integrated memory assembly 104. Data bus may also be referred to herein as a communication channel. Communication channel 332 is depicted as being connected to integrated memory assembly 104 for generality. Communication channel 332 may connect to either or both of die 302 and/or 304. In one embodiment, communication channel 332 connects memory controller 102 directly to control die 304. In one embodiment, communication channel 332 connects memory controller 102 directly to memory die 302. If communication channel 332 connects memory controller 102 directly to memory die 302, then pathway 352 may be used to allow communication between memory controller 102 and control circuitry 310.

The integrated memory assembly typically has pins, pads, or other electrical contacts. Some of these electrical contacts allow the integrated memory assembly 104 to be connected to a data bus 332. Memory controller interface 340 is an electrical interface for communicating with memory controller 102. For example, memory controller interface 340 may implement a Toggle Mode Interface that connects to the Toggle Mode interfaces of memory interface 228/258 for memory controller 102. In one embodiment, memory controller interface 340 includes a set of input and/or output (I/O) pins that connect to communication channel 332 (also refers to herein as a data bus). In one embodiment, communication channel 332 connects to the memory controller 102 as part of the Toggle Mode Interface.

The current measurement 330 is able to measure current usage during a memory operation. The memory operation is controlled by the control die 304, and performed in the memory die 302. In one embodiment, the current measurement 330 measures current usage in the integrated memory assembly 104 during a program operation. In one embodiment, the current usage is the total current usage by the control die 304 and the memory die 302 in order to perform the memory operation. Although current measurement 330 is depicted on the control die 304, in another embodiment, the current measurement 330 is located on the memory die 302.

The integrated memory assembly 104 is provided with a supply voltage (e.g., Vcc). In one embodiment, the supply voltage is provided to an electrical contact on a substrate to which the control die 304 and memory die 302 are attached (see for example, substrate 1102, FIGS. 11A, 11B). The current Icc is the current associated with the supply voltage (Vcc). In one embodiment, the current measurement 330 measures the supply current Icc. In one embodiment, Icc is sampled and some proportion of Icc is mirrored to resistor 338. Current measurement 330 then samples a voltage on resistor 338. The current through resistor 338 can be calculated based on the sampled voltage by knowing the resistance of resistor 338. Therefore, the magnitude of Icc can be determined by knowing what proportion of Icc was mirrored to resistor 338. Many other techniques can be used to measure the supply current Icc. For example, although resistor 338 is depicted off-chip, the resistor 338 could be located on (i.e., within) one of the dies 302, 304. In some embodiments, there are multiple memory dies 302 in the integrated memory assembly 104. In such cases, there could be one resistor 338 for each memory die 302.

In one embodiment, the resistor 338 is a ZQ resistor. The ZQ resistor may be used to during what is conventionally referred to as ZQ calibration. ZQ calibration is used to match on-chip impedance with off-chip impedance to improve data transfer. For example, a data input circuit on the integrated memory assembly 104 may have a termination resistor for impedance matching to the data bus 332. The ZQ resistor may be used to calibrate the resistance of the termination resistor. However, since the ZQ resistor is not needed for calibration purposes during memory operations (e.g., program, read, erase), the ZQ resistor can be used to measure current usage during memory operations. In one embodiment, the ZQ resistor is used as a shunt resistor, in which some proportion of Icc is mirrored though the ZQ resistor. The foregoing is just one example of a way to measure the current usage during memory operations. The current measurement 330 is not limited to the foregoing technique.

The error correction code (ECC) engine 334 is configured to decode and error correct codewords. Herein, ECC engine 334 may be referred to as an on-die ECC engine. In one embodiment, the on-die ECC engine 334 is configured to encode data bits from the memory controller 102 into codewords that contain the data bits and parity bits. The control circuitry stores the codewords in the memory structure 326. In one embodiment, the on-die ECC engine 334 is configured to decode the codewords, which are read back from the memory structure 326. In some embodiments, the ECC engine 334 is used to determine a bit error rate (BER) of data stored in the memory structure 326.

Any subset of components in the control circuitry 310 can be considered one or more control circuits. Any subset of components in the control circuitry 310 in combination with the memory controller 102 can be considered one or more control circuits. Processor 312, current measurement 330, power control 316, read/write circuits 328, and/or memory controller 102 (or equivalently functioned circuits), in combination with all or a subset of the other circuits depicted in FIG. 3, can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory die 302. In one embodiment, pathways provide a connection between control die 304 and memory die 302. A portion of each pathway resides in the memory die 302 and a portion of each pathway reside in the control die 304. The term pathway may be used for portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. Pathways 352 allow the control circuitry 310 to provide voltages to word lines, select lines, and bit lines on memory die 302, in one embodiment. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include phase change memory (e.g., PCM), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 3 depicts one control die 304 and one memory die 302 in an integrated memory assembly 104, there may be more than one control die 304 and more than one memory die 302 in an integrated memory assembly 104. In some cases, a single control die 304 may control more than one memory die 302.

Figure 4:
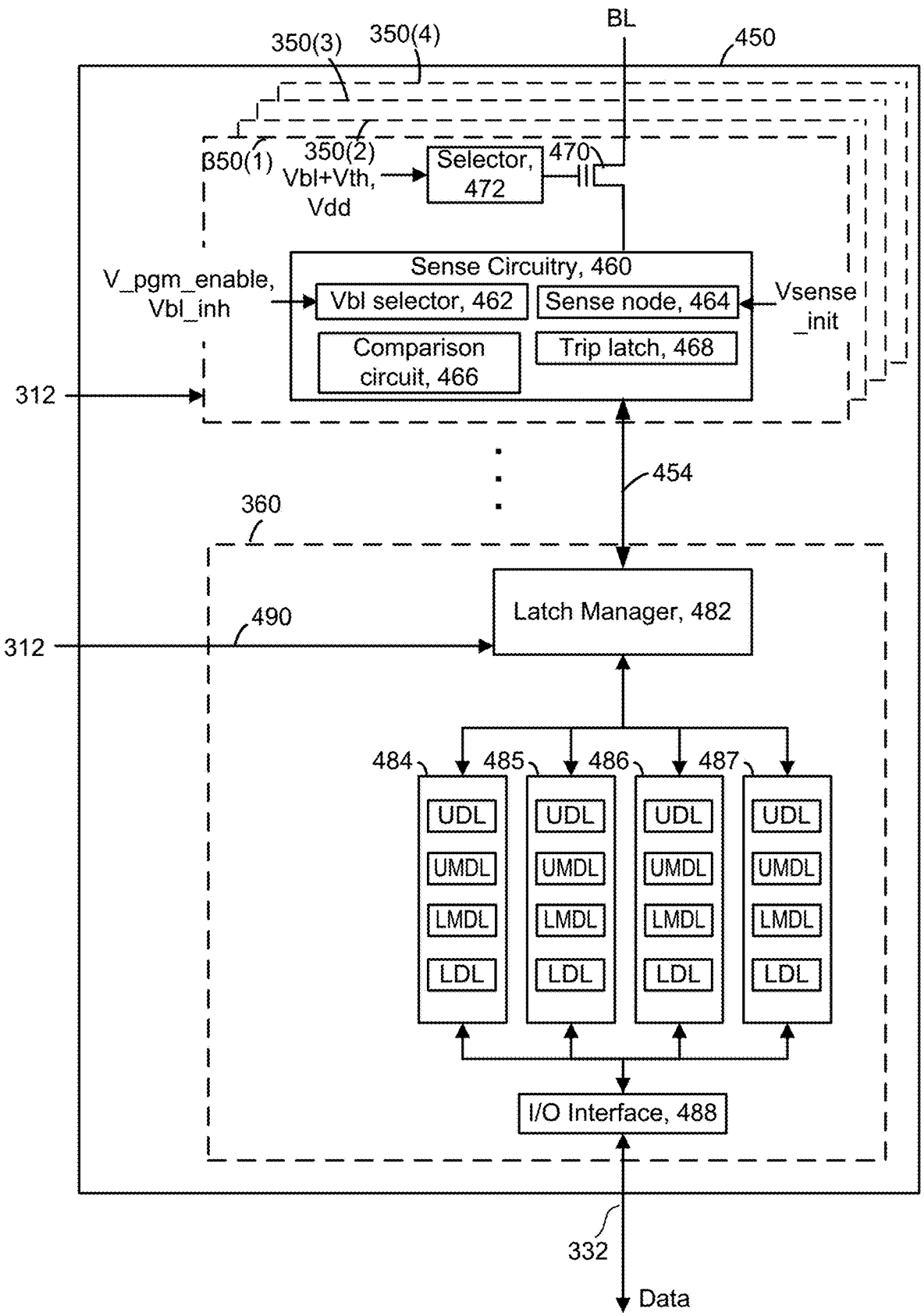
FIG. 4 is a block diagram depicting one embodiment of a sense block.

FIG. 4 is a block diagram depicting one embodiment of a sense block 450, which operates under control of processor 312. The sense block is part of the read/write circuits 328. There may be many sense blocks 450 in the read/write circuits 328. An individual sense block 450 is partitioned into one or more core portions, referred to as sense circuits or sense amplifiers 350(1)-350(4), and a common portion, referred to as a managing circuit 360. In one embodiment, there will be a separate sense amplifier for each bit line/NAND string and one common managing circuit 360 for a set of multiple, e.g., four or eight, sense amplifier. Each of the sense amplifier in a group communicates with the associated managing circuit 360 via data bus 454. Thus, there are one or more latch managing circuits which communicate with the sense amplifier of a set of storage elements (memory cells). The processor 312 controls the overall operation of the sense amplifiers 350 and the managing circuit 360; however, some aspects of the sense amplifiers 350 and managing circuit 360 may operate independent of control from the processor 312.

The sense amplifier 350(1), as an example, comprises sense circuitry 460 that performs sensing by determining whether a conduction current in a connected bit line is above or below a predetermined threshold level. The sensing can occur in a read or verify operation. The sense amplifier also supplies a bit line voltage during the application of a program voltage in a program operation. The processor 312 controls the timing and magnitude of the bit line voltages.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line under control of processor 312. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V.

The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the latch manager 482. In some embodiments, the processor 312 performs computations, such as to determine the data stored in the sensed memory cell. To make such computations, the latch manager 482 may provide the processor 312 with data (e.g., a bit) from the trip latch 468.

The managing circuit 360 comprises a latch manager 482, four example sets of data latches 484, 485, 486, 487 and an I/O Interface 488 coupled between the sets of data latches and data bus 332 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The latch manager 482 operates under control of the processor 312. The latch manager 482 may, however, perform some operations independent of control of the processor 312. In some embodiments, latch manager 482 is implemented in hardware, which may include but is not limited to discrete logic (e.g., XOR gates, AND gates, invertors, etc.). In some embodiments, the latch manager 482 performs computations, such as to determine the data stored in the sensed memory cell. In one embodiment, to determine the data stored in the sensed memory cell, the latch manager 482 may contain discrete logic, such as, but not limited to XOR gates. The latch manager 482 may also contain latches that may be used to store information to facilitate determining the data stored in the sensed memory cell. However, determining the data stored in the sensed memory cell using discrete logic may have limitations such as not being able to change a page mapping scheme. In some embodiments, using the processor 312 to determine the data in the memory cell allows the page mapping scheme to be changed. Further details of embodiments of changing a page mapping scheme are described below.

The determined data (whether determined by processor 312 or independently by latch manager 482) may be stored in the set of data latches. Each set of data latches 484-487 is used to store data bits determined during a read operation, and to store data bits imported from the data bus 332 during a program operation which represent write data meant to be programmed into the memory. I/O interface 488 provides an interface between data latches 484-487 and the data bus 332.

In one embodiment, the latch manager 482 is used to determine what voltage to apply to the bit line, based on the state of the latches. Thus, the latch manager 482 may perform some operations independent of processor 312, thus alleviating the need for the processor 312 to perform all computations and/or decisions.

During reading, the operation of the system is under the control of processor 312 that controls the supply of different control gate voltages to the addressed memory cell. As it steps through the various predefined control gate voltages corresponding to the various memory states supported by the memory, the sense circuitry 460 may trip at one of these voltages and a corresponding output will be provided from sense circuitry 460 to latch manager 482 via the data bus 454. In one embodiment, the latch manager 482 determines the resultant memory state by consideration of the tripping event(s) of the sense circuitry 460 and the information about the applied control gate voltage from the processor 312 via input lines 490. The latch manager 482 then computes a binary encoding for the memory state and stores the resultant data bits into data latches 484-487.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the processor 312, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, latch manager 482 monitors the read back memory state relative to the desired memory state. When the two are in agreement, the latch manager 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5:
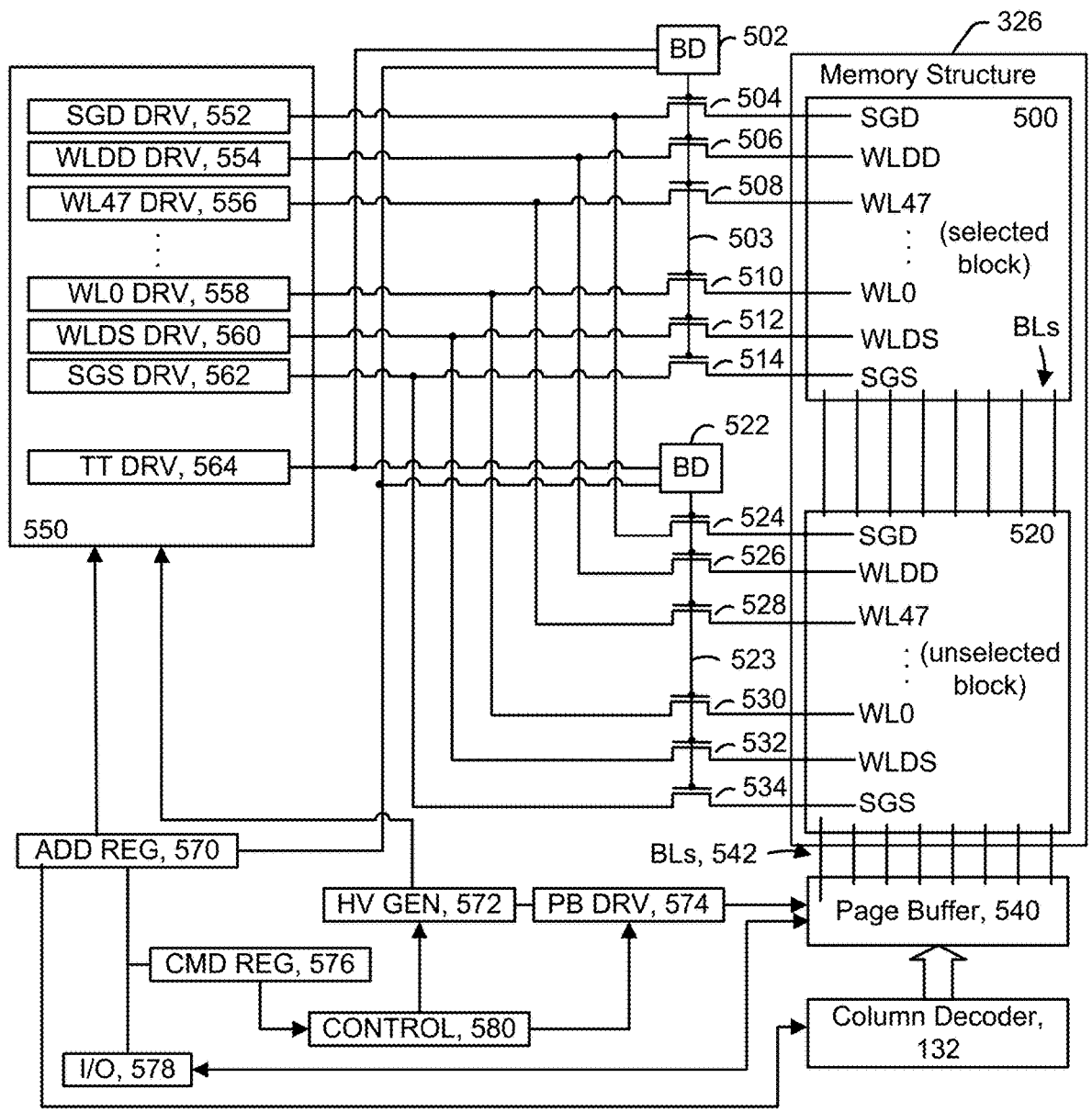
FIG. 5 is a diagram that shows further details of one embodiment of circuitry for applying voltages to a memory structure in a memory die.

FIG. 5 is a diagram that shows further details of one embodiment of circuitry for applying voltages to a memory structure 326 in a memory die 302. Two blocks 500, 520 of memory cells are depicted. These are two of many blocks in the memory structure 326. In one embodiment, the rest of the circuitry in FIG. 5 resides on the control die 304. However, some of the other circuitry could reside on the memory die 302. In one embodiment, the page buffer 540 resides on the memory die 302. In one embodiment, both the page buffer 540 and the column decoder 132 reside on the memory die 302.

The circuitry in FIG. 5 operates under control of processor 312. Circuits of FIG. 5 apply voltages to word lines, select lines, and bit lines. For example, the processor 312 may issue control signals to one or more of CONTROL 580, HV (High Voltage) GEN (Generator) 572, PB (Page Buffer) DRV (Driver) 574, CMD (Command) REG (Register) 576, I/O (Input/Output) Buffer 578. In one embodiment, the processor 312 issues control signals to CONTROL 580, which in turn controls other elements such as HV GEN 572 and PB DRV 574.

A high voltage generator (HV GEN) 572 is connected to the word line driver 550 and to page buffer drivers (PB DRV) 574. The word line drivers 550 are controlled by the processor 312 to control magnitudes and timing of voltages to word lines and select lines in the memory structure 326, in one embodiment. PB DRV 574 is connected to page buffer 540 to control the page buffer 540. The page buffer 540 may include sense blocks, such as sense blocks 450 in FIG. 4. In one embodiment, the processor 312 controls the PB DRV 574 to control magnitude and timing of voltages applied to the bit lines (BLs) 542.

Each block of storage elements is associated with a set of transfer transistors, in one possible embodiment. For example, block 500, which is the selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL46-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514. The control gate of each transfer transistor of the block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, the BD 502 acts as a conductive switch which passes the voltage to the control gates of the associated transfer transistors via path 503. If the address does not match the address of the BD 502, the BD 502 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 550. Each driver may be provided a voltage from HV GEN 572. For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled by processor 312 to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, . . . , a transfer transistor 530 connected to WL0 and WL0 DRV 558, a transfer transistor 532 connected to WLDS and WLDS DRV 560, and a transfer transistor 534 connected to SGS and SGS DRV 562. The control gates of the transfer transistors of the unselected block 520 are connected to a respective block decoder (BD) 522 via a common path 523. The BD 522 is also connected to the TT DRV 564 to receive a voltage, and to the address register 570 to receive a control signal which instructs the BD 522 to pass or not pass the voltage to the control gates of the associated transfer transistors via path 523. The address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to a column decoder 132. The page buffers stores data which is written into, or read from, a selected word line of the selected block. During an operation of the memory device, the address register 570 provides a data load command to an input-output buffer 578 and to a command register 576. The input-output buffer 578 provides the command to the page buffer 540. The command register 576 provides a command to a control circuit 580, which instructs high voltage generator (HV GEN) 572 to control the voltage drivers 550 at appropriate levels. Typically, during programming, the driver of the selected word line provides a programming level voltage, such as 12-26 V while the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. The control 580 also instructs the page buffer driver (PB DRV) 574 to control the page buffer 540. The address register 570 also communicates with the column decoder 132.

Figure 6:
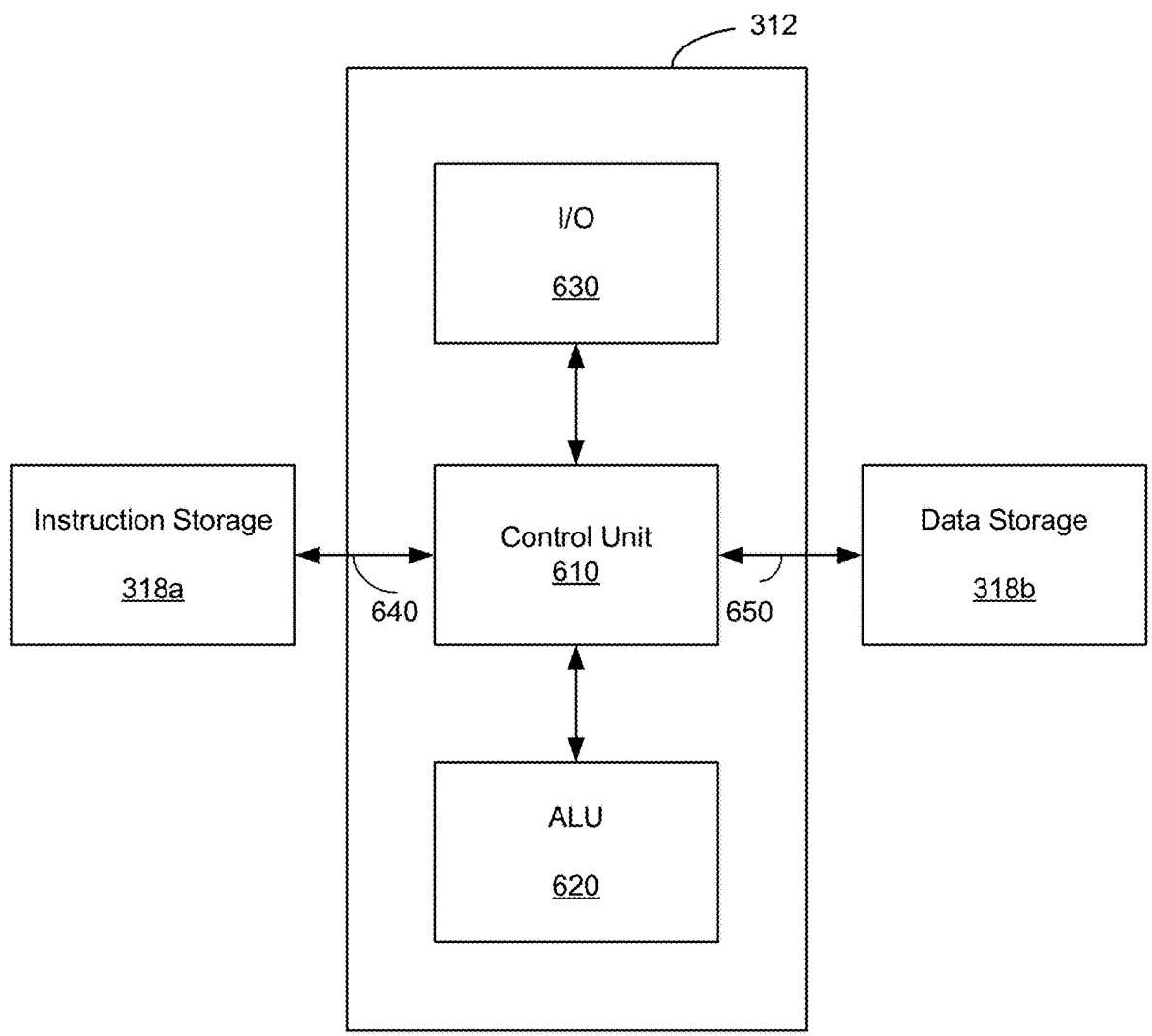
FIG. 6 is a diagram of one embodiment of a processor, connected to storage.

As noted, a control die 304 may have a processor to perform various functionality described herein. FIG. 6 is a diagram of one embodiment of a processor 312 on a control die 304. The processor 312 has a control unit 610, an arithmetic logic unit (ALU), and input/output (I/O) 630. In the embodiment in FIG. 6, the storage 318 is divided between instruction storage 317 and data storage 318. There is one pathway 640 between the control unit 610 and the instruction storage 317, and another pathway 650 between the control unit 610 and the data storage 318. However, it is not required that there be a separate instruction storage 317 and data storage 318. Also, it is not required that there be two pathways 640, 650. In one embodiment, there is a single pathway between the control unit 610 and storage 318.

In some embodiments, the control unit 610 contains an instruction register and a program counter. The program counter stores the address of a program instruction in instruction storage 318. The control unit 610 may also contain instruction fetcher that is configured to fetch an instruction identified by the program counter from instruction storage 318. The control unit 610 may also contain an instruction decoder that is configured to decode the instruction. The control unit 610 may also contain an instruction executer that is configured to execute the decoded instructions. The control unit 610 may also registers, which may be used for temporary storage of parameters.

The ALU 620 is used to perform arithmetic operations, such as determine voltage magnitudes to be applied to the memory structure 326. In one embodiment, the ALU performs arithmetic and bitwise operations on integer binary numbers. In one embodiment, the ALU 620 is a combinational digital electric circuit. For example, the ALU 620 may contain discrete logic such as AND gates, NAND gates, NOR gates, OR gates, XOR gates, etc. In some embodiments, the ALU 620 may be referred to as a processing unit.

In one embodiment, the input/output (I/O) 630 receives commands from the memory controller interface 340. For example, the memory controller interface 340 may send read, write (or program), erase or other commands to the I/O 630. The control unit 610 accesses and executes suitable instructions from instruction storage 318 for the command. The control unit 610 may also access various parameters and settings from the data storage 318. The control unit 610 instructs the I/O 630 to issue control signals in order to control various circuits to effect the memory operation. The I/O 630 sends the control signals to circuits such as power control 316 and read/write circuits 328.

The processor 312 may have a wide variety of instruction set architectures. In some embodiments, the processor 312 has a RISC architecture. In one embodiment, the processor 312 has a RISC-V architecture. However, the processor 312 is not limited to a RISC architecture.

The processor 312 is programmable and reprogrammable. The processor 312 may be programmed by storing instructions into the instruction storage 318, which are then executed in the processor 312. The processor 312 may be reprogrammed by updating, or otherwise modifying the instructions in the instruction storage 318, which are then executed in the processor 312. In some embodiments, when the control die 304 is booted, program instructions are loaded from the memory structure storage region 336 to instruction storage 318. Parameters and/or settings may be loaded from the memory structure storage region 336 to data storage 318.

The elements in processor 312 may comprise, but are not limited to, one or more of a microprocessor, an electrical circuit, an application specific integrated circuit (ASIC), a Field Programmable Gate Array (FPGA), a digital logic circuit, an analog circuit, gates, flip flops, latches, RAM/ROM, and/or combinational logic.

Figure 7:
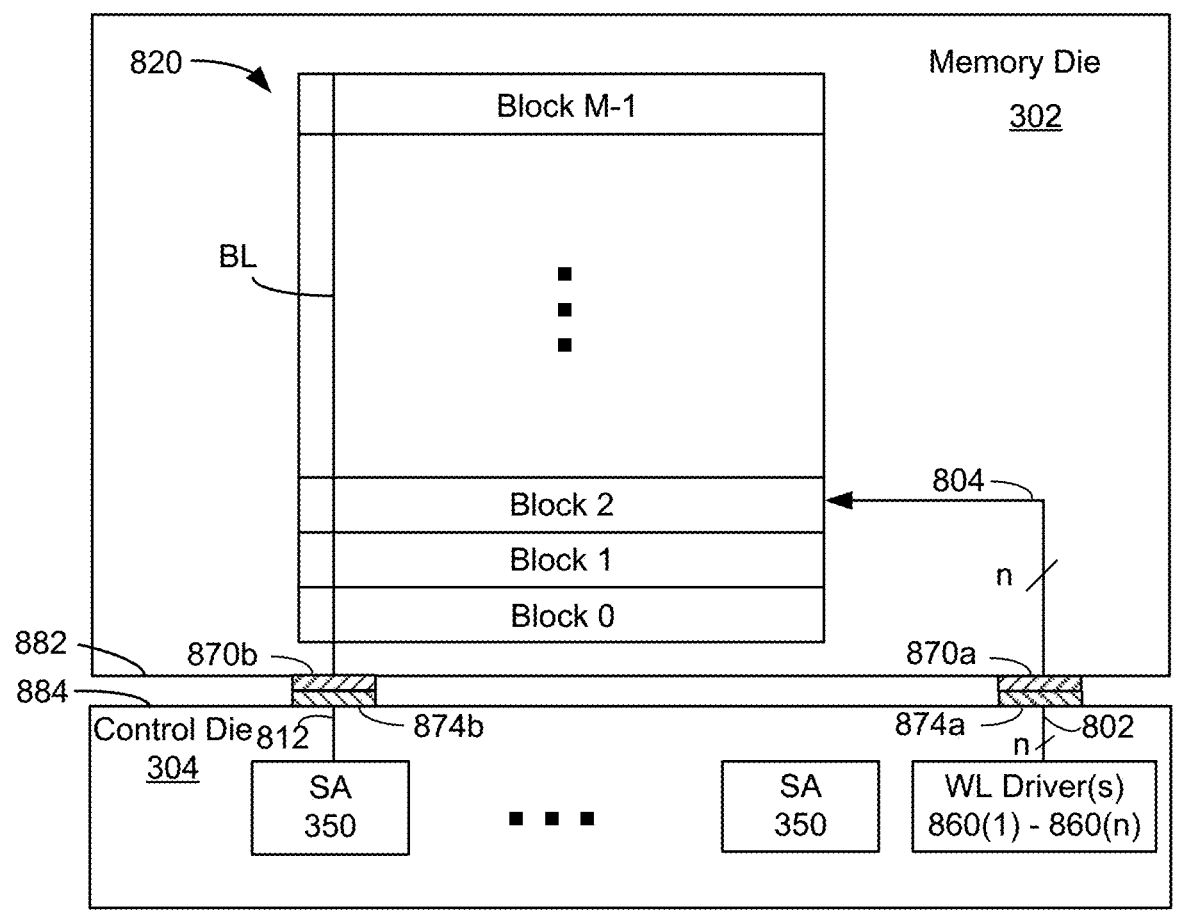
FIG. 7 is a block diagram of an embodiment of an integrated memory assembly.

FIG. 7 is a block diagram of one embodiment of an integrated memory assembly 104. FIG. 7 depicts further details of one embodiment of the integrated memory assembly 104 of FIG. 1A or 3. Memory die 302 contains a plane 820 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 7, Block 0 and Block M−1 of plane 820 are at the edges of the memory structure (or otherwise referred to as being located in an edge region/section of the memory structure).

In one embodiment, the control die 304 includes a number of sense amplifiers (SA) 350. In an alternative embodiment, the sense amplifiers (SA) 350 reside on the memory die 302. The processor 312 controls the sense amplifiers 350 (whether on the control die 304 or memory die 302). By updating the instructions and/or parameters used by the processor 312 the operation of the sense amplifier 350 can be modified. Each sense amplifier 350 is connected to one bit line, in this example. The sense amplifier contains a bit line driver, in one embodiment. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 860(1)-860(n). The word line drivers 860 are configured to provide voltages to word lines. In this example, there are "n" word lines per block of memory cells. In one embodiment, one of the blocks in the plane 820 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 860 provide voltages to the word lines in a first selected block (e.g., Block 2) in memory die 302. The control die 304 may also include charge pumps, voltage generators, and the like, which may be used to provide voltages for the word line drivers 860 and/or the bit line drivers.

The memory die 302 has a number of bond pads 870a, 870b on a first major surface 882 of memory die 302. There may be "n" bond pads 870a, to receive voltages from a corresponding "n" word line drivers 860(1)-860(n). There may be one bond pad 870b for each bit line associated with plane 820. The reference numeral 870 will be used to refer in general to bond pads on major surface 882.

In some embodiments, each data bit and each parity bit of a codeword are transferred through a different bond pad pair 870b, 874b. The bits of the codeword may be transferred in parallel over the bond pad pairs 870b, 874b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 874a, 874b on a first major surface 884 of control die 304. There may be "n" bond pads 874a, to deliver voltages from a corresponding "n" word line drivers 860(1)-860(n) to memory die 302a. There may be one bond pad 874b for each bit line associated with plane 820. The reference numeral 874 will be used to refer in general to bond pads on major surface 882. Note that there may be bond pad pairs 870a/874a and bond pad pairs 870b/874b. In some embodiments, bond pads 870 and/or 874 are flip-chip bond pads.

The pattern of bond pads 870 matches the pattern of bond pads 874, in one embodiment. Bond pads 870 are bonded (e.g., flip chip bonded) to bond pads 874, in one embodiment. Thus, the bond pads 870, 874 electrically and physically couple the memory die 302 to the control die 304. Also, the bond pads 870, 874 permit internal signal transfer between the memory die 302 and the control die 304. Thus, the memory die 302 and the control die 304 are bonded together. Although FIG. 7 depicts one control die 304 bonded to one memory die 302, in one embodiment, one control die 304 is bonded to two memory dies 302.

Herein, "internal signal transfer" means signal transfer between the control die 304 and the memory die 302. The internal signal transfer permits the circuitry on the control die 304 to control memory operations in the memory die 302. Therefore, the bond pads 870, 874 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 870, 874 may be formed for example of copper, aluminum and alloys thereof. There may be a liner between the bond pads 870, 874 and the major surfaces (882, 884). The liner may be formed for example of a titanium/titanium nitride stack. The bond pads 870, 874 and liner may be applied by vapor deposition and/or plating techniques. The bond pads and liners together may have a thickness of 720 nm, though this thickness may be larger or smaller in further embodiments.

Figure 13A:
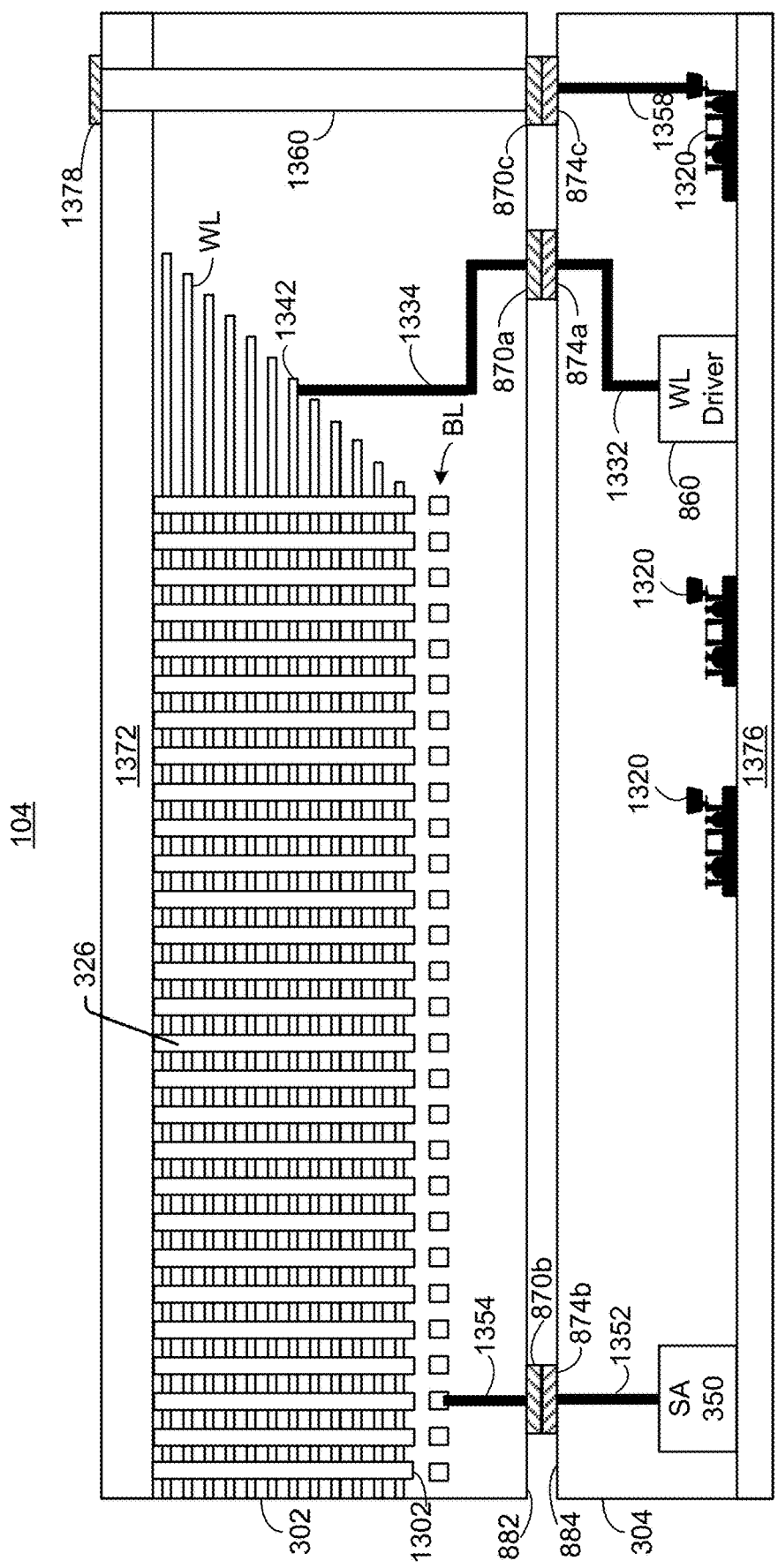
FIG. 13A is a diagram of one embodiment of an integrated memory assembly.

Metal interconnects and/or vias may be used to electrically connect various elements in the dies to the bond pads 870, 874. Several conductive pathways, which may be implemented with metal interconnects and/or vias are depicted. For example, a sense amplifier 350 may be electrically connected to bond pad 874b by pathway 812. There may be thousands of such sense amplifiers, pathways, and bond pads. Note that the BL does not necessarily make direct connection to bond pad 870b. The word line drivers 860 may be electrically connected to bond pads 874a by pathways 802. Note that pathways 802 may comprise a separate conductive pathway for each word line driver 860(1)-860(n). Likewise, there may be a separate bond pad 874a for each word line driver 860(1)-860(n). The word lines in block 2 of the memory die 302 may be electrically connected to bond pads 870a by pathways 804. In FIG. 7, there are "n" pathways 804, for a corresponding "n" word lines in a block. There may be a separate pair of bond pads 870a, 874a for each pathway 804. FIG. 13A depicts further details of one embodiment of an integrated memory assembly 104 having metal interconnects and/or vias.

Figure 8:
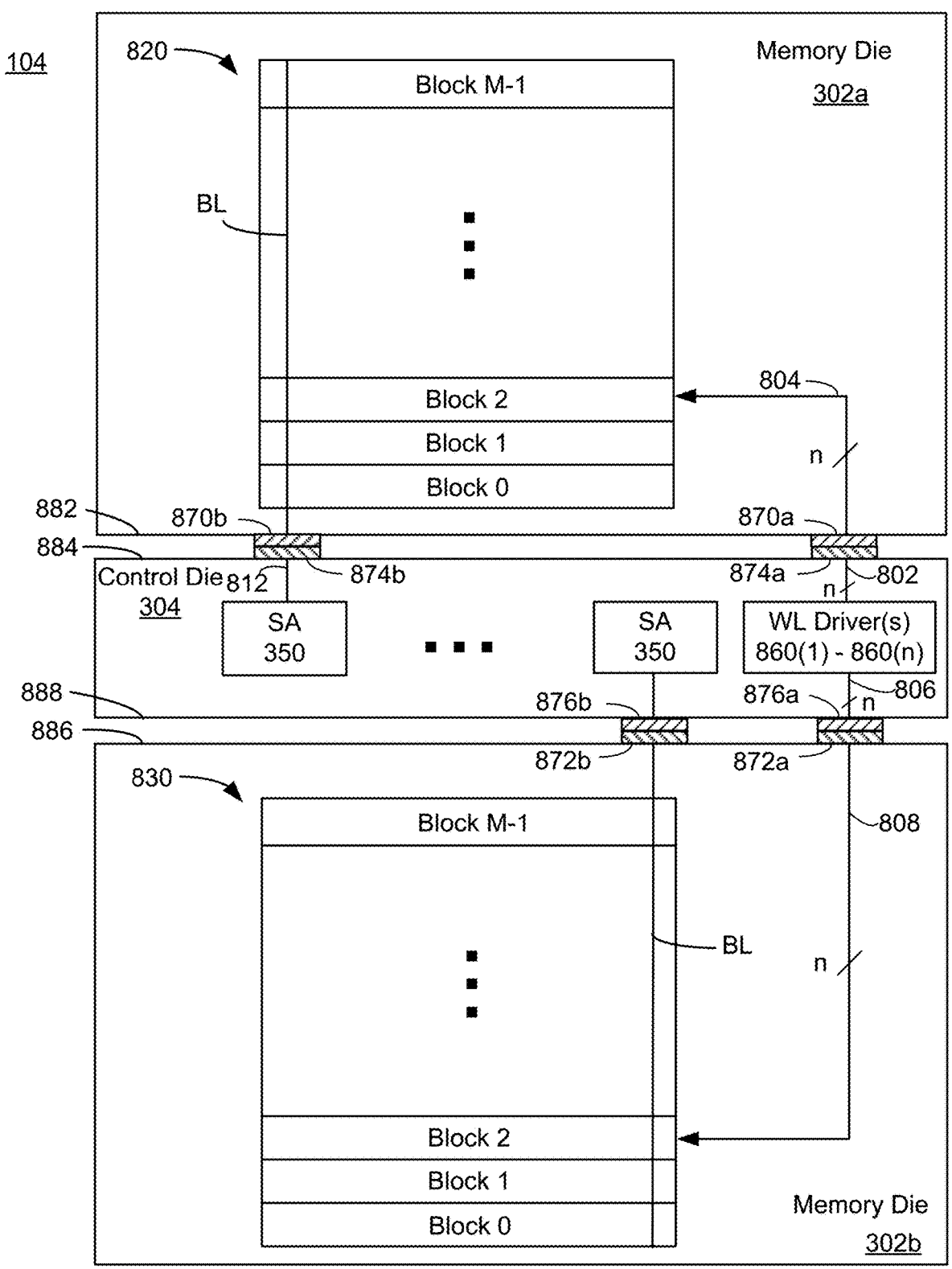
FIG. 8 is a block diagram of an embodiment of an integrated memory assembly in which a control die controls two memory dies.

FIG. 8 depicts another embodiment of an integrated memory assembly 104 in which one control die 304 may be used to control two memory die 302a, 302b. The control die 304 has a number of a number of bond pads 874(a), 874(b) on a first major surface 884, as discussed in connection with FIG. 7. The control die 304 has a number of a number of bond pads 876(a), 876(b) on a second major surface 888. There may be "n" bond pads 876(a) to deliver voltages from a corresponding "n" word line drivers 860(1)-860(n) to memory die 302b. The word line drivers 860 may be electrically connected to bond pads 876a by pathways 806. There may be one bond pad 876b for each bit line associated with plane 830 on memory die 302b. The reference numeral 876 will be used to refer in general to bond pads on major surface 888.

The second memory die 302b has a number of bond pads 872a, 872b on a first major surface 886 of second memory die 302b. There may be "n" bond pads 872a, to receive voltages from a corresponding "n" word line drivers 860(1)-860(n). The word lines in plane 830 may be electrically connected to bond pads 872a by pathways 808. There may be one bond pad 872b for each bit line associated with plane 830. The reference numeral 872 will be used to refer in general to bond pads on major surface 886. Note that there may be bond pad pairs 872a/876a and bond pad pairs 872b/876b. In some embodiments, bond pads 872 and/or 876 are flip-chip bond pads.

In an embodiment, the "n" word line drivers 860(1)-860(n) are shared between the two memory die 302a, 302b. For example, a single word line driver may be used to provide a voltage to a word line in memory die 302a and to a word line in memory die 302b. However, it is not required that the word line drivers 860 are shared between the memory dies 302a, 302b.

Figure 9A:
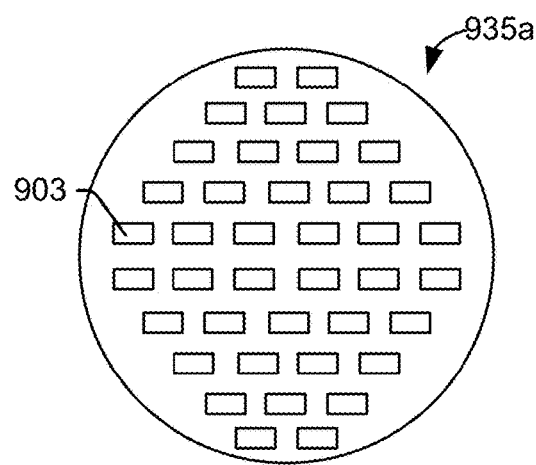
FIGS. 9A and 9B are top views of semiconductor wafers.

FIG. 9A is a top view of a semiconductor wafer 935a from which multiple control die 304 may be formed. The wafer 935a has numerous copies of integrated circuits 903. Each of the integrated circuits 903 contains the control circuitry 310 (see FIG. 3), in one embodiment. The wafer 935a is diced into semiconductor dies, each containing one of the copies of the integrated circuits 903, in some embodiments. Therefore, numerous control semiconductor dies 304 may be formed from the wafer 935a. Also note that even before the wafer 935a is diced, as the term "control semiconductor die" is used herein, each region in which an integrated circuit 903 resides may be referred to as a control semiconductor die 304.

Figure 9B:
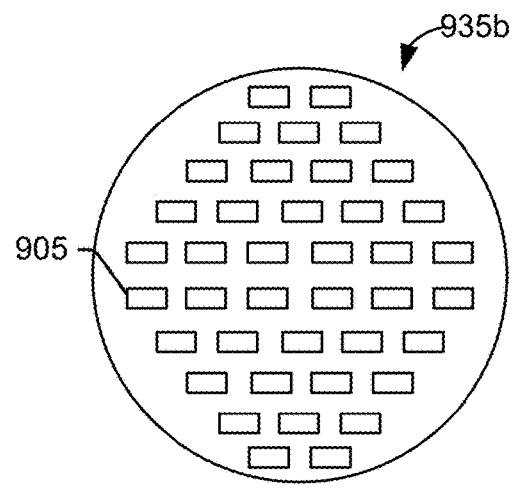

FIG. 9B is a top view of a semiconductor wafer 935b from which multiple memory die 302 may be formed. The wafer 935b has numerous copies of integrated circuits 905. Each of the integrated circuits 905 contains memory structure 326 (see FIG. 3), in one embodiment. The wafer 935b is diced into semiconductor dies, each containing one of the copies of the integrated circuits 905, in some embodiments. Therefore, numerous memory semiconductor dies 302 may be formed from the wafer 935b. Also note that even before the wafer 935b is diced, as the term "memory semiconductor die" is used herein, each region in which an integrated circuit 905 resides may be referred to as a memory semiconductor die 302.

The semiconductor wafers 935 may start as an ingot of monocrystalline silicon grown according to either a CZ, FZ or other process. The semiconductor wafers 935 may be cut and polished on major surfaces to provide smooth surfaces. The integrated circuits 903, 905 may be formed on and/or in the major surfaces. The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

Figure 10:
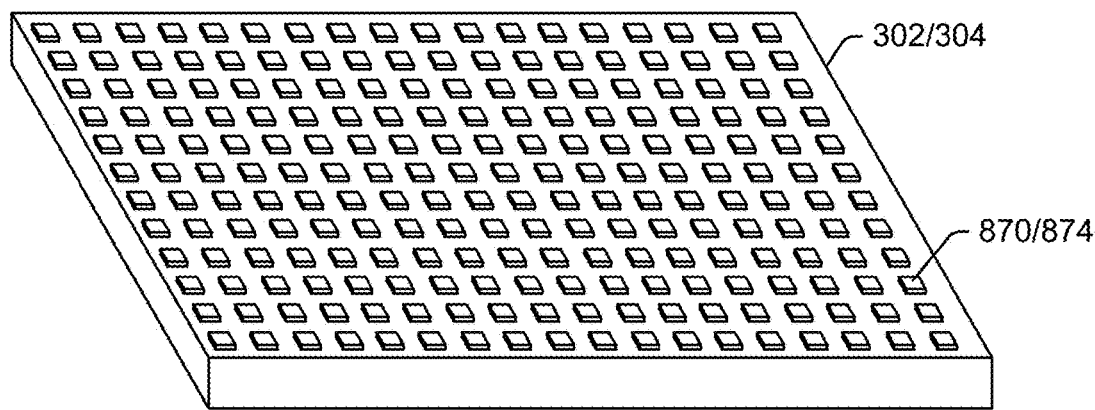
FIG. 10 depicts an example pattern of bond pads on a planar surface of a semiconductor die.

As has been briefly discussed above, the control die 304 and the memory die 302 may be bonded together. Bond pads on each die 302, 304 may be used to bond the two dies together. Recall that FIG. 7 depicts one example of bonds 870 on the memory die 302, as well as bonds 874 on the semiconductor die 304. FIG. 10 depicts an example pattern of bond pads on a planar surface of a semiconductor die. The semiconductor die could be memory die 302 or control die 304. The bond pads could be any of bond pads 870 or 874, as appropriate for the semiconductor die. There may be many more bond pads than are depicted in FIG. 10. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 870, 874 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11A:
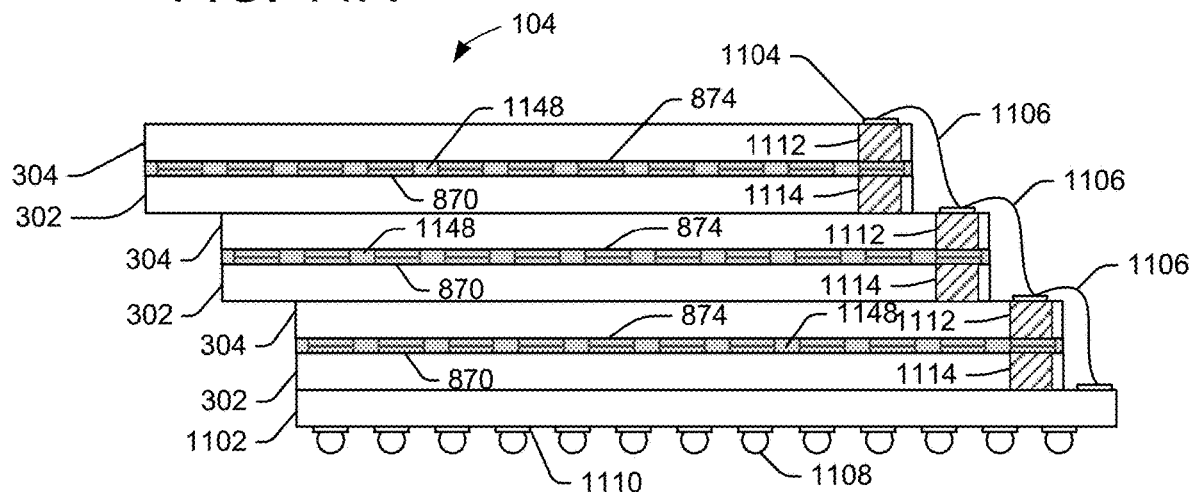
FIG. 11A depicts a side view of an embodiment of an integrated memory assembly stacked on a substrate.

In some embodiments, there is more than one control die 304 and more than one memory die 302 in an integrated memory assembly 104. In some embodiments, the integrated memory assembly 104 includes a stack of multiple control die 304 and multiple memory die 302. FIG. 11A depicts a side view of an embodiment of an integrated memory assembly 104 stacked on a substrate 1102 (e.g., a stack comprising control dies 304 and memory dies 302). The integrated memory assembly 104 has three control die 304 and three memory die 302. In some embodiments, there are many more than three memory die 302 and many more than three control die 304.

Each control die 304 is affixed (e.g., bonded) to at least one of the memory die 302. Some of the bond pads 870, 874, are depicted. There may be many more bond pads. A space between two dies 302, 304 that are bonded together is filled with a solid layer 1148, which may be formed from epoxy or other resin or polymer. This solid layer 1148 protects the electrical connections between the dies 302, 304, and further secures the dies together. Various materials may be used as solid layer 1148, but in embodiments, it may be Hysol epoxy resin from Henkel Corp., having offices in California, USA.

The integrated memory assembly 104 may for example be stacked with a stepped offset, leaving the bond pads 1104 at each level uncovered and accessible from above. Wire bonds 1106 connected to the bond pads 1104 connect the control die 304 to the substrate 1102. A number of such wire bonds may be formed across the width of each control die 304 (i.e., into the page of FIG. 11A).

A memory die through silicon via (TSV) 1112 may be used to route signals through a memory die 302. A control die through silicon via (TSV) 1114 may be used to route signals through a control die 304. The TSVs 1112, 1114 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package. The solder balls 1108 may form a part of the interface between the integrated memory assembly 104 and the memory controller 102. In some embodiment, a supply voltage (e.g., Vcc) is provided to the assembly 104 by one of the contact pads 1110. The supply voltage (e.g., Vcc) may be provided to individual control dies 304 by way of wire bonds 1106.

Figure 11B:
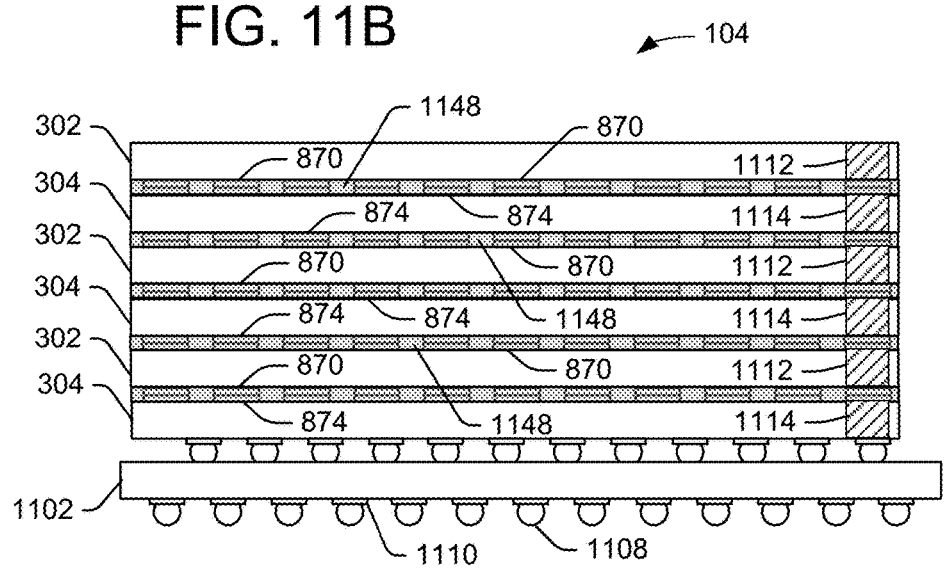
FIG. 11B depicts a side view of an embodiment of an integrated memory assembly stacked on a substrate.

FIG. 11B depicts a side view of an embodiment of an integrated memory assembly 104 stacked on a substrate 1102. The integrated memory assembly 104 has three control die 304 and three memory die 302. In some embodiments, there are many more than three memory die 302 and many more than three control die 304. In this example, each control die 304 is bonded to at least one memory die 302. Optionally, a control die 304 may be bonded to two memory die 302. Some of the bond pads 870, 874 are depicted. There may be many more bond pads. A space between two dies 302, 304 that are bonded together is filled with a solid layer 1148, which may be formed from epoxy or other resin or polymer. In contrast to the example in FIG. 11A, the integrated memory assembly 104 in FIG. 11B does not have a stepped offset. A memory die through silicon via (TSV) 1112 may be used to route signals through a memory die 302. A control die through silicon via (TSV) 1114 may be used to route signals through a control die 304.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package.

Figure 12:
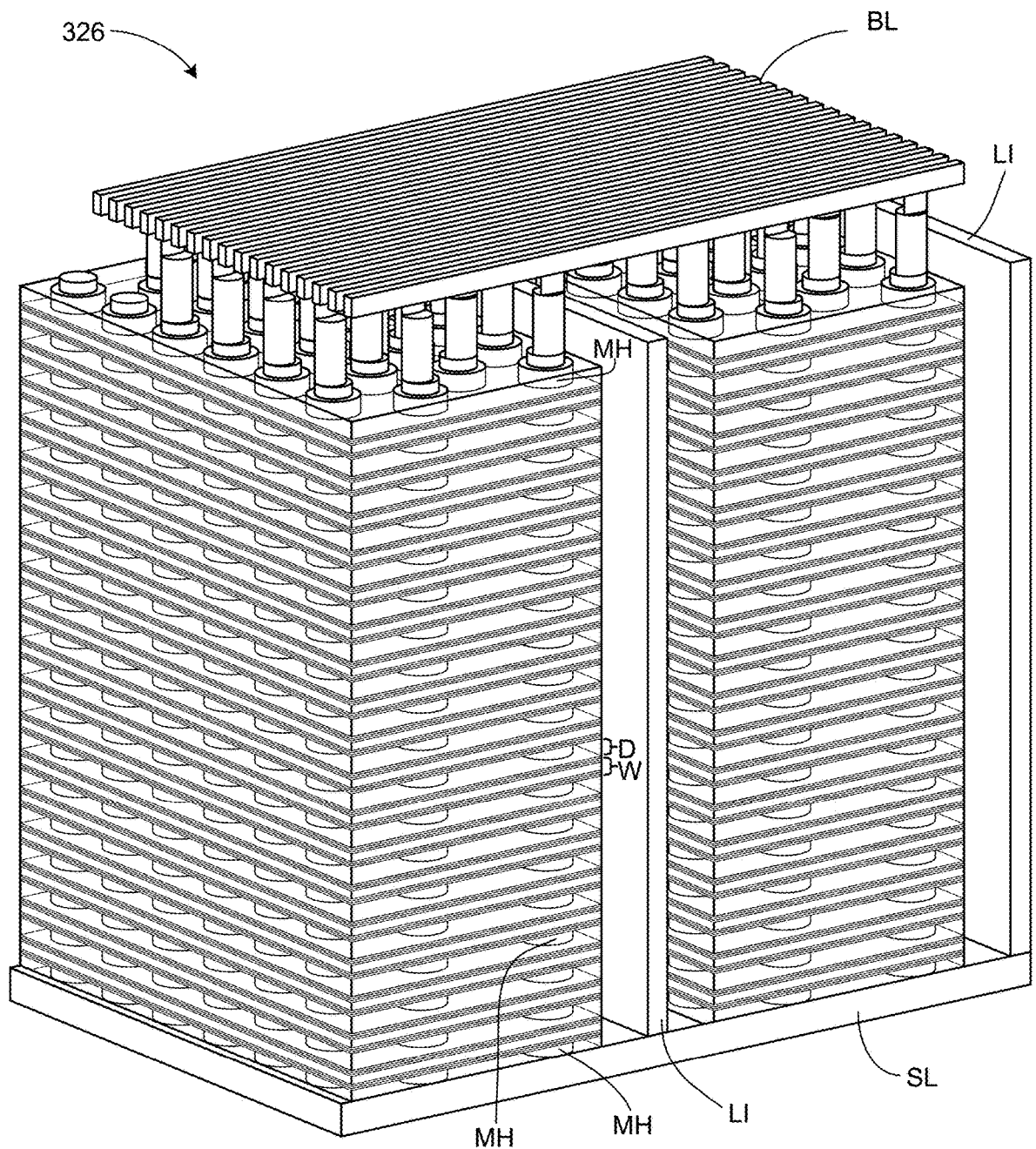
FIG. 12 is a perspective view of a portion of one example embodiment of a monolithic three dimensional memory array that can comprise memory structure.

FIG. 12 is a perspective view of a portion of one example embodiment of a monolithic three dimensional memory array that can comprise memory structure 326, which includes a plurality non-volatile memory cells. For example, FIG. 12 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 9, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

FIG. 13A is a diagram of one embodiment of an integrated memory assembly 104. In an embodiment depicted in FIG. 13A, memory die 302 is bonded to control die 304. This bonding configuration is similar to an embodiment depicted in FIG. 7. Note that although a gap is depicted between the pairs of adjacent dies, such a gap may be filled with an epoxy or other resin or polymer. FIG. 13A shows additional details of one embodiment of pathways 352.

The memory die includes a memory structure 326. Memory structure 326 is adjacent to substrate 1372 of memory die 302. The substrate 1372 is formed from a portion of a silicon wafer, in some embodiments. In this example, the memory structure 326 include a three-dimensional memory array. The memory structure 326 has a similar structure as the example depicted in FIG. 12. There are a number of word line layers (WL), which are separated by dielectric layers. The dielectric layers are represented by gaps between the word line layers. Thus, the word line layers and dielectric layers form a stack. There may be many more word line layers than are depicted in FIG. 13A. As with the example of FIG. 12, there are a number of columns that extend through the stack. One column 1302 is referred to in each stack with reference numeral 1302. The columns contain memory cells. For example, each column may contain a NAND string. There are a number of bit lines (BL) adjacent to the stack.

Word line driver 860 concurrently provides voltages to a word line 1342 in memory die 302. The pathway from the word line driver 860 to the word line 1342 includes conductive pathway 1332, bond pad 874a, bond pad 870a, and conductive pathway 1334. In some embodiments, conductive pathways 1332, 1334 are referred to as a pathway pair. Conductive pathways 1332, 1334 may each include one or more vias (which may extend vertically with respect to the major surfaces of the die) and one or more metal interconnects (which may extend horizontally with respect to the major surfaces of the die). Conductive pathways 1332, 1334 may include transistors or other circuit elements. In one embodiment, the transistors may be used to, in effect, open or close the pathway. Other word line drivers (not depicted in FIG. 13A) provide voltages to other word lines. Thus, there are additional bond pad 874a, 870a in addition to bond pads 874a, 870a. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1352, bond pad 874b, bond pad 870b, and conductive pathway 1354. In some embodiments, conductive pathways 1352, 1354 are referred to as a pathway pair. Conductive pathways 1352, 1354 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1352, 1354 may include transistors or other circuit elements. In one embodiment, the transistors may be used to, in effect, open or close the pathway.

The control die 304 has a substrate 1376, which may be formed from a silicon wafer. The sense amplifiers 350, word line driver(s) 860, and other circuitry 1320 may be formed on and/or in the substrate 1376. The circuitry 1320 may include some or all of the control circuitry 310 (see FIG. 3). In some embodiments, sense amplifiers 350, word line driver(s) 860, and/or other circuitry 1320 comprise CMOS circuits.

There is an external signal path that allows circuitry on the control die 304 to communicate with an entity external to the integrated memory assembly 104, such as memory controller 102. Therefore, circuitry 1320 on the control die 304 may communicate with, for example, memory controller 102 (see FIG. 3). Optionally, circuitry on the control die 304 may communicate with, for example, host 120. The external pathway includes via 1358 in control die 304, bond pad 874c, bond pad 870c, through silicon via (TSV) 1360, and external pad 1378. The TSV 1360 extends through substrate 1372.

The TSV 1360, may be formed before, during or after formation of the integrated circuits in the semiconductor dies 302, 304. The TSV may be formed by etching holes through the wafers. For example, holes may be etched through substrate 1372. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to an embodiment depicted in FIG. 13A are possible. One modification is for sense amplifiers 350 to be located on memory die 302.

Figure 13B:
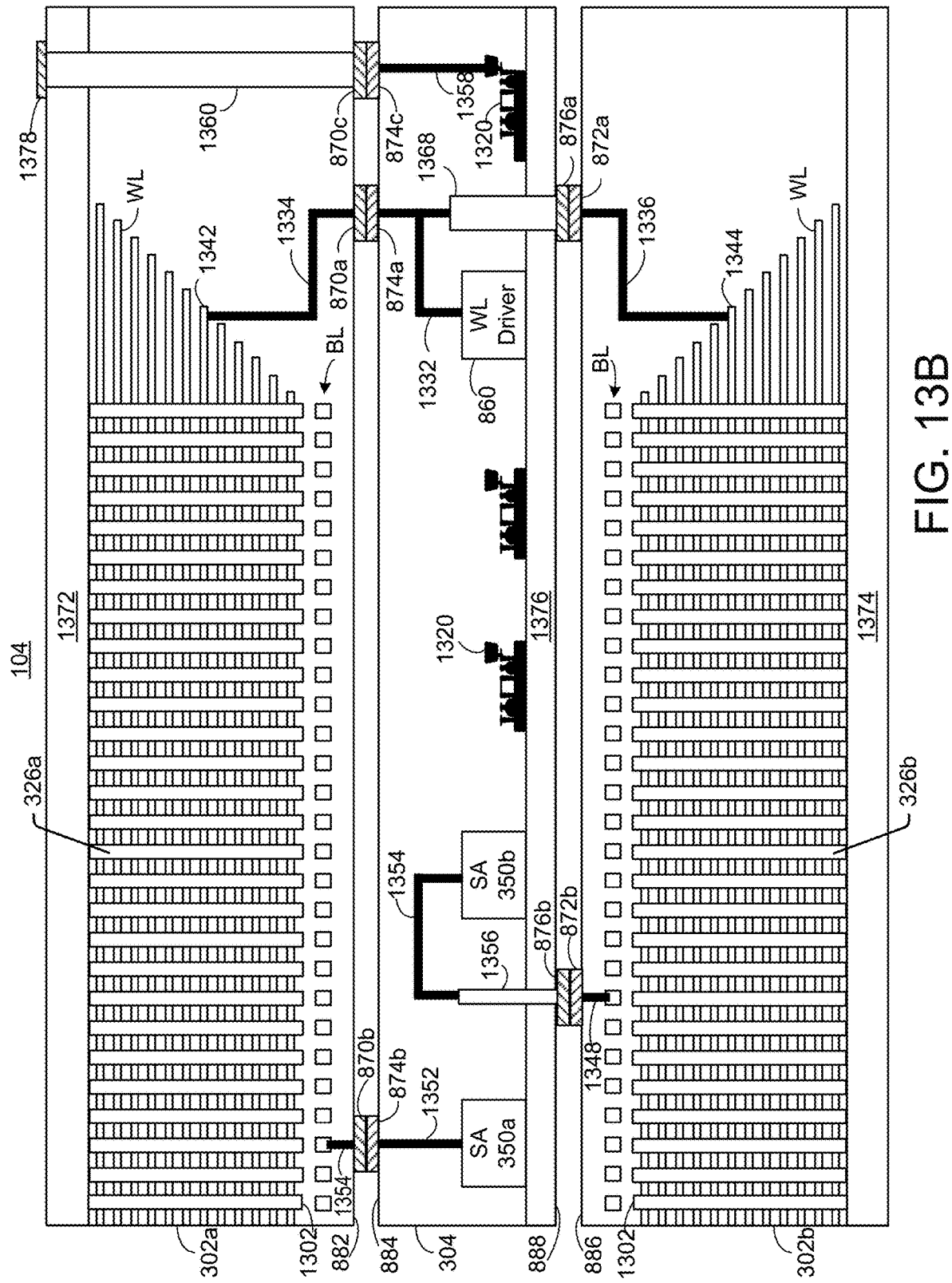
FIG. 13B is a diagram of one embodiment of an integrated memory assembly in which one control die controls two memory die.

FIG. 13B is a diagram of one embodiment of an integrated memory assembly 104. This bonding configuration is similar to an embodiment depicted in FIG. 8. The configuration in FIG. 13B adds an extra memory die relative to the configuration in FIG. 13A. Hence, similar reference numerals are used for memory die 302a in FIG. 13B, as were used for memory die 302 in FIG. 13A. In an embodiment depicted in FIG. 13B, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1372 of memory die 302a. Memory structure 326b is adjacent to substrate 1374 of memory die 302b. The substrates 1372, 1374 are formed from a portion of a silicon wafer, in some embodiments. In this example, the memory structures 326 each include a three-dimensional memory array.

Word line driver 860 concurrently provides voltages to a first word line 1342 in memory die 302a and a second word line 1344 in memory die 302b. The pathway from the word line driver 860 to the second word line 1344 includes conductive pathway 1332, through silicon via (TSV) 1368, bond pad 876a, bond pad 872a, and conductive pathway 1336. Other word line drivers (not depicted in FIG. 13B) provide voltages to other word lines.

Sense amplifier 350a is in communication with a bit line in memory die 302a. The pathway from the sense amplifier 350a to the bit line includes conductive pathway 1352, bond pad 874b, bond pad 870b, and conductive pathway 1354. Sense amplifier 350b is in communication with a bit line in memory die 302b. The pathway from the sense amplifier 350b to the bit line includes conductive pathway 1354, TSV 1356, bond pad 876b, bond pad 872b, and conductive pathway 1348.

Numerous modifications to an embodiment depicted in FIG. 13B are possible. One modification is for sense amplifiers 350a to be located on first memory die 302a, and for sense amplifiers 350b to be located on second memory die 302b. In the embodiment depicted in FIG. 13B, the control die 304 is directly connected to the two memory dies 302a, 302b. However, in another embodiment, the control die 304 is indirectly connected to at least one memory die 302 controlled by the control die 304. For example, with reference to FIG. 13B, the physical locations of control die 304 and memory die 302b can be swapped, such that control die 304 is directly connected to memory die 302b, but indirectly connected to memory die 302a.

Figure 14:
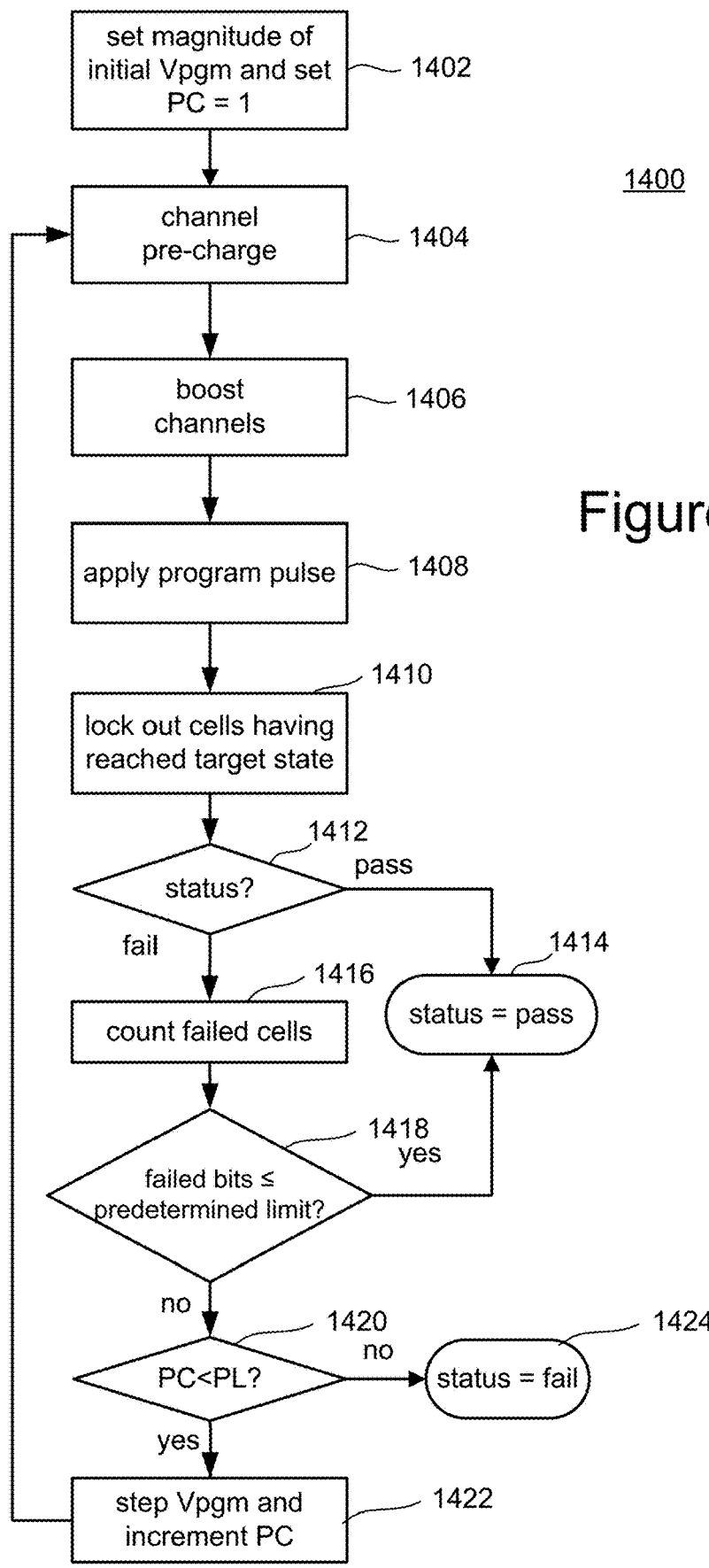
FIG. 14 is a flowchart describing one embodiment of a process for programming NAND strings of memory cells organized into an array.

FIG. 14 is a flowchart describing one embodiment of a process 1400 for programming NAND strings of memory cells organized into an array. In one example embodiment, the process of FIG. 14 is performed on integrated memory assembly 104 using the control circuitry 310 discussed above. For example, the process of FIG. 14 can be performed at the direction of processor 312. The process includes multiple loops, each of which includes a program phase (e.g., steps 1404-1408) and a verify phase (e.g., steps 1410-1418).

In many implementations, the magnitude of the program pulses is increased with each successive pulse by a predetermined step size. In step 1402 of FIG. 14, the programming voltage (Vpgm) is initialized to the starting magnitude (e.g., ~12-16V or another suitable level) and a program counter PC maintained by processor 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1404 the memory system will pre-charge channels of NAND strings that include memory cells connected to the selected word line that are to be inhibited from programming.

In step 1406, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1408, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1408, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1410, memory cells that have reached their target states are locked out from further programming. Step 1410 may include performing verifying at one or more verify reference levels. In one embodiment, the verification process is performed by testing whether the threshold voltages of the memory cells selected for programming have reached the appropriate verify reference voltage.

In step 1410, a memory cell may be locked out after the memory cell has been verified (by a test of the Vt) that the memory cell has reached its target state.

If, in step 1412, it is determined that all of the memory cells have reached their target threshold voltages (pass), the programming process is complete and successful because all selected memory cells were programmed and verified to their target states. A status of "PASS" is reported in step 1414. Otherwise if, in step 1412, it is determined that not all of the memory cells have reached their target threshold voltages (fail), then the programming process continues to step 1416.

In step 1416, the memory system counts the number of memory cells that have not yet reached their respective target threshold voltage distribution. That is, the system counts the number of memory cells that have, so far, failed to reach their target state. This counting can be done by the processor 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1418, it is determined whether the count from step 1416 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1414. Thus, the programming process ends successfully even though some memory cells have not been programmed to their intended data state. In this situation, enough memory cells programmed correctly such that the few remaining memory cells that have not been completely programmed can be corrected using ECC during the read process. In some embodiments, the predetermined limit used in step 1418 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1420 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1424. If the program counter PC is less than the program limit value PL, then the process continues at step 1422 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1422, the process loops back to step 1404 and another program pulse is applied to the selected word line so that another iteration (steps 1404-1422) of the programming process of FIG. 14 is performed.

Figure 15A:
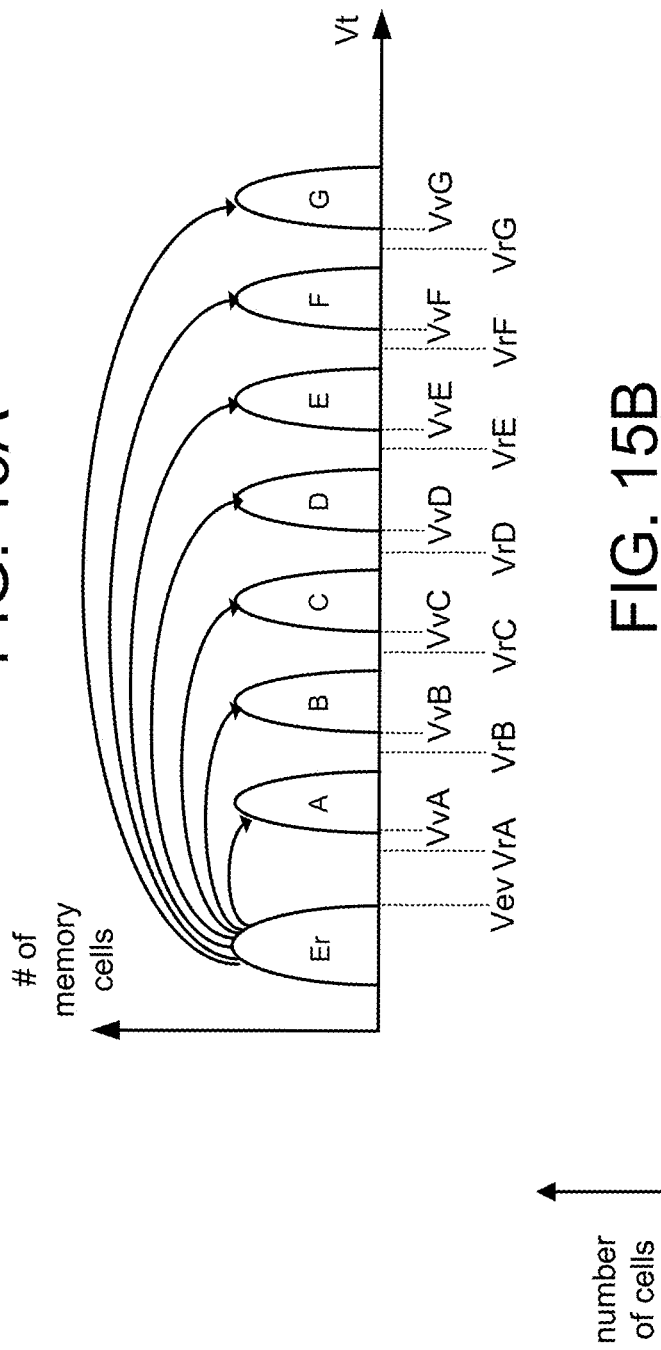
FIG. 15A illustrates example threshold voltage distributions for the memory array when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. FIG. 15A illustrates example threshold voltage distributions for the memory array when each memory cell stores three bits of data. Other embodiments, however, may use other data capacities per memory cell (e.g., such as one, two, four, or five bits of data per memory cell). FIG. 15A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 15A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 15A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 15A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 15A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 15A) or verify operation (e.g. see verify target levels VvA, VvB, VvC, VvD, VvE, VvF, and VvG of FIG. 15A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 15B:
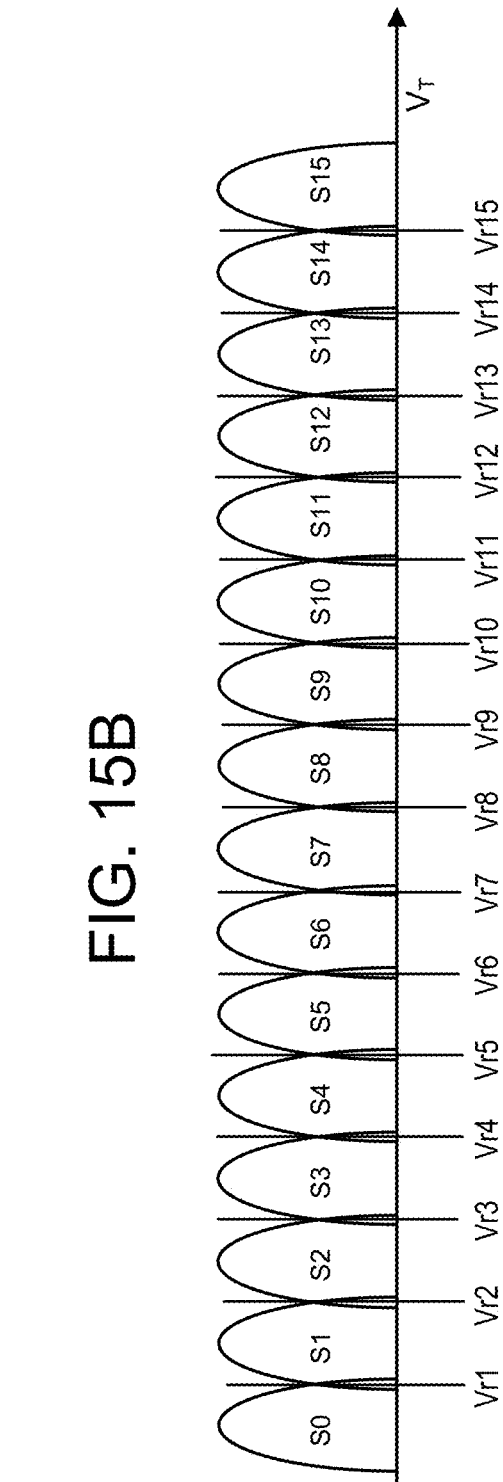
FIG. 15B depicts threshold voltage distributions in which each memory cell stores four bits of data.

FIG. 15B depicts threshold voltage distributions and one page mapping scheme when each memory cell stores four bits of data. FIG. 15B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible.

As noted, FIG. 15B depicts an example in which four bits are stored per memory cell. Thus, four pages may be stored in a set of memory cells. Fifteen read reference levels are depicted (Vr1-Vr15). The set of memory cells may be connected to the same word line.

Figure 16:
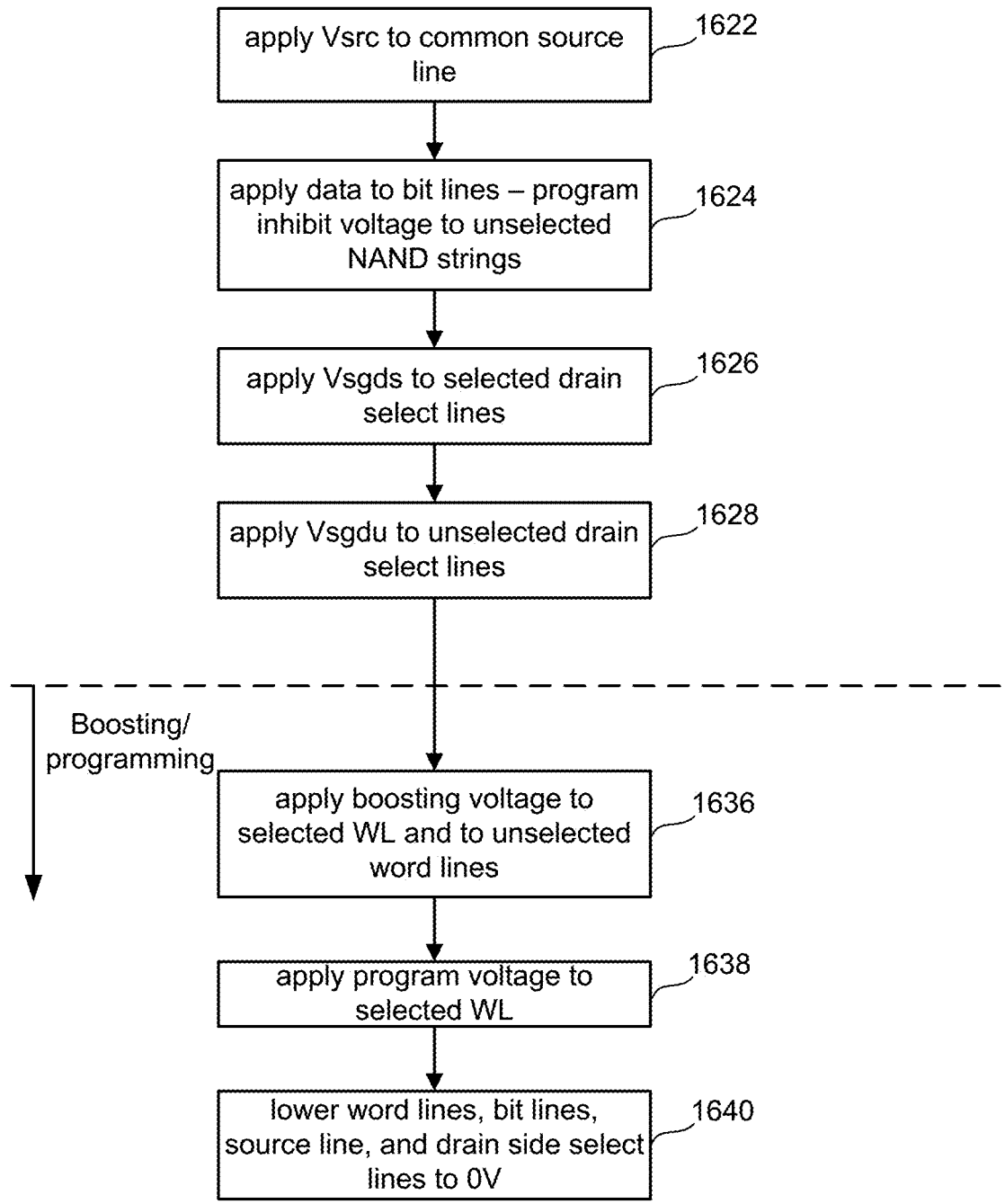
FIG. 16 depicts a flowchart of one embodiment of applying a program pulse and programming voltages that may be used in step 1408 of FIG. 14.
Figure 17:
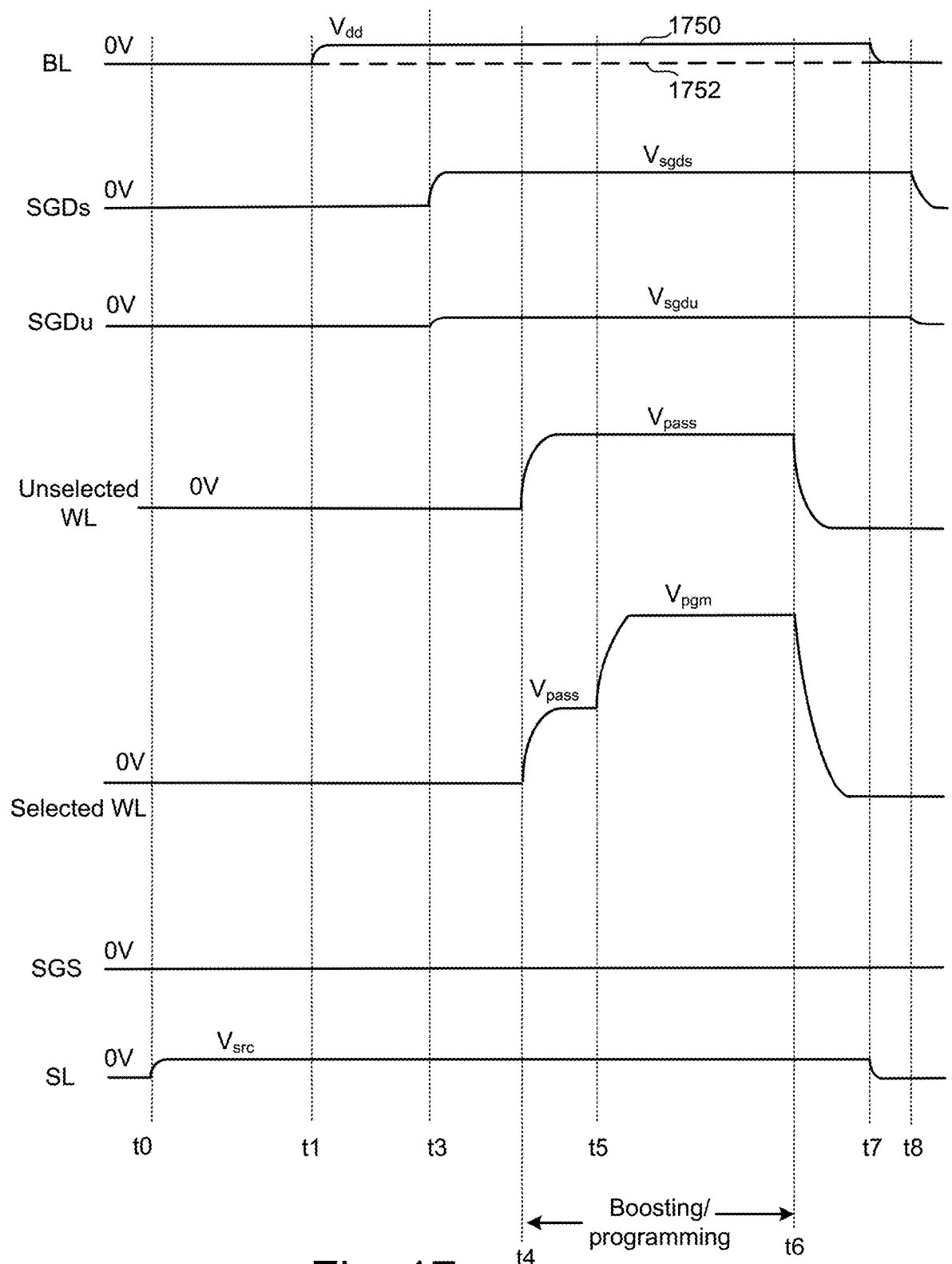
FIG. 17 shows timing of various signals during one embodiment of the process of FIG. 16.

FIGS. 16 and 17 depict further details of one embodiment of a programming phase of a programming operation. FIG. 16 depicts a flowchart of one embodiment of applying a program pulse and programming voltages that may be used in step 1408 of FIG. 14. This process is used to program 3D NAND in one embodiment. FIG. 17 shows timing of various signals during one embodiment of the process of FIG. 16. The processor 312 controls the timing and magnitudes of the signals in FIG. 17, in one embodiment.

A low voltage is applied to the source line at step 1622. Referring to FIG. 17, the common source line SL is raised to a low voltage Vsrc (e.g., about 1.0V-1.5V) at time t0 where it remains for the duration of the programming phase. The source line SL is kept at 0V in some embodiments. The source select line SGS remains at 0V to place the source select transistors into isolation mode. As one example this could be on the order of 1.0V-1.5V. Note that the other signals in FIG. 17 are at 0V at time t0.

At step 1624, the data is applied to the bit lines. In one embodiment, the processor 312 controls the sense amplifiers 350 to apply the data to the bit lines. The data may be applied to the bit lines based on whether a memory cell in the NAND strings that are in the present programming phase is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 17, line 1752 shows the bit line voltage at 0V for a NAND string (in the set that are a part of the present programming phase) having a memory cell at the selected word line WLn that is to be programmed. Line 1750 shows the bit line voltage at $V_{DD}$ for a NAND string (in the set that are a part of the present programming phase) having a cell at WLn that is to be inhibited from programming. $V_{DD}$ designates program inhibit and is often referred to as a program inhibit voltage. Note that line 1752 represents one example of V_Program_Enable, and that line 1750 represents one example of Vbl_Inhibit.

Step 1626 is to apply Vsgds to selected drain side select lines. Step 1628 is to apply Vsgdu to unselected drain side select lines. Note that FIG. 17 shows two SGD lines. Line SGDs refers to a drain side select line having at least one NAND string that is currently programming. Line SGDu refers to a drain side select line having no NAND strings currently programming.

Referring to FIG. 17, at time t3, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time t3.

Note that at this time Vsgds may also be applied to control gates of drain side select transistors of NAND strings for which no memory cell should be programmed. However, note that Vbl_Inhibit is being applied to the unselected bit line BL1 at time t3.

Referring again to FIG. 17, at time t3, drain side select line SGDu is set to Vsgdu. The voltage Vsgdu should keep off the associated drain side select transistor.

At step 1636, a boosting voltage (e.g., $V_{PASS}$) is applied to unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 17, at time $t_4$, the boosting/programming begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program phase of a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 1638. With the boosting voltages applied and the inhibited NAND string channels boosted, program disturb of unselected memory cells on the selected word line is prevented or reduced.

Referring to FIG. 17, at time $t_5$, the program voltage $V_{PGM}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 1640, the word lines, bit lines, source lines, and drain select lines are lowered to 0V, marking the completion of one programming iteration (e.g., one program phase). It should be noted that the steps of FIG. 16 can be applied with each iteration of the process of FIG. 14, with the program voltage being increased each iteration. However, it is not required that the program voltage increase in magnitude with each iteration.

Referring to FIG. 17, at time t6, the word lines are lowered to 0V. The source and bit lines are then lowered to 0V at time t7. The drain select line SGD is lowered to 0V at time t8.

Figure 18:
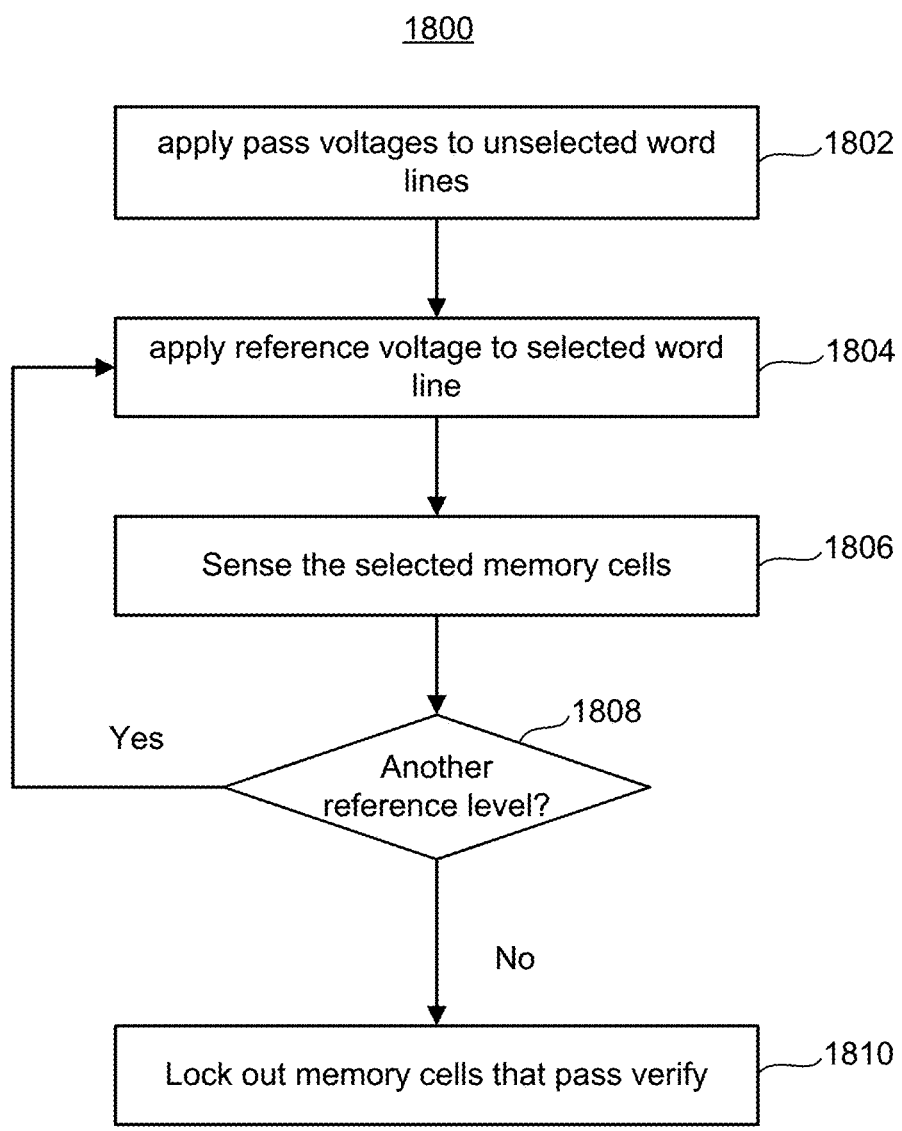
FIG. 18 depicts a flowchart describing a verify operation performed to verify whether a memory cells has been programmed to its target data state.

FIG. 18 depicts a flowchart describing an embodiment of a verify phase of a program operation performed to verify whether a memory cells has been programmed to its target data state. The process may be performed under control of the processor 312. The process 1800 can be used during step 1410 of process 1400.

In step 1802, a pass voltage is applied to unselected word lines so that unselected memory cells on a NAND string are conducting, which enables the system to test whether the selected memory cell conducts in response to the verify reference voltage. This pass voltage is often referred to as Vread. In step 1804, the appropriate verify reference voltage, also referred to as Vcgr, is applied to the selected word line (e.g., VvA, VvB, etc.).

Step 1806 includes sensing the selected memory cells. In one embodiment, the trip latch 468 in the sense amplifier 350 connected to the bit line for one of the selected memory cells may trip in response to the reference voltage applied to the selected word line. A corresponding output will be provided from the sense amplifier 350 to the latch manager 482 by way of the data bus 454. In one embodiment, the processor 312 is notified when the memory cell trips.

In some embodiments, sensing in step 1806 includes the following. In one example embodiment, a capacitor in the sense amplifier is charged up. The bit line is connected to the capacitor to allow the bit line to discharge the capacitor in response to the reference voltage in step 1804. After a predetermined time period, referred to as the "integration time" or "strobe time" the voltage of the capacitor is sampled to see whether the respective memory cell(s) conducted. If the memory cell conducts in response to Vcgr, the trip latch 468 trips, indicating that the threshold voltage of the memory cell is less than Vcgr. There are many other techniques for sensing a memory cell.

Step 1808 is a determination of whether there is another verify reference level to apply to the selected word line. Again, a determination will be made whether the memory cells trip in response to the reference voltage applied to the selected word line.

Based on the reference level (if any) when the trip latch 468 in the sense amplifier 350 trips, the control die 304 will determine whether the memory cell has reached its target state. For example, if the memory cell is being programmed to the C data state, the control die 304 determines whether the threshold voltage of the memory cell is at least VvC.

In step 1810, memory cells that pass verify are locked out from further programming. In some embodiment, the voltage applied to the bit line during the programming phase is used to control whether the memory cell is locked out.

Figure 19:
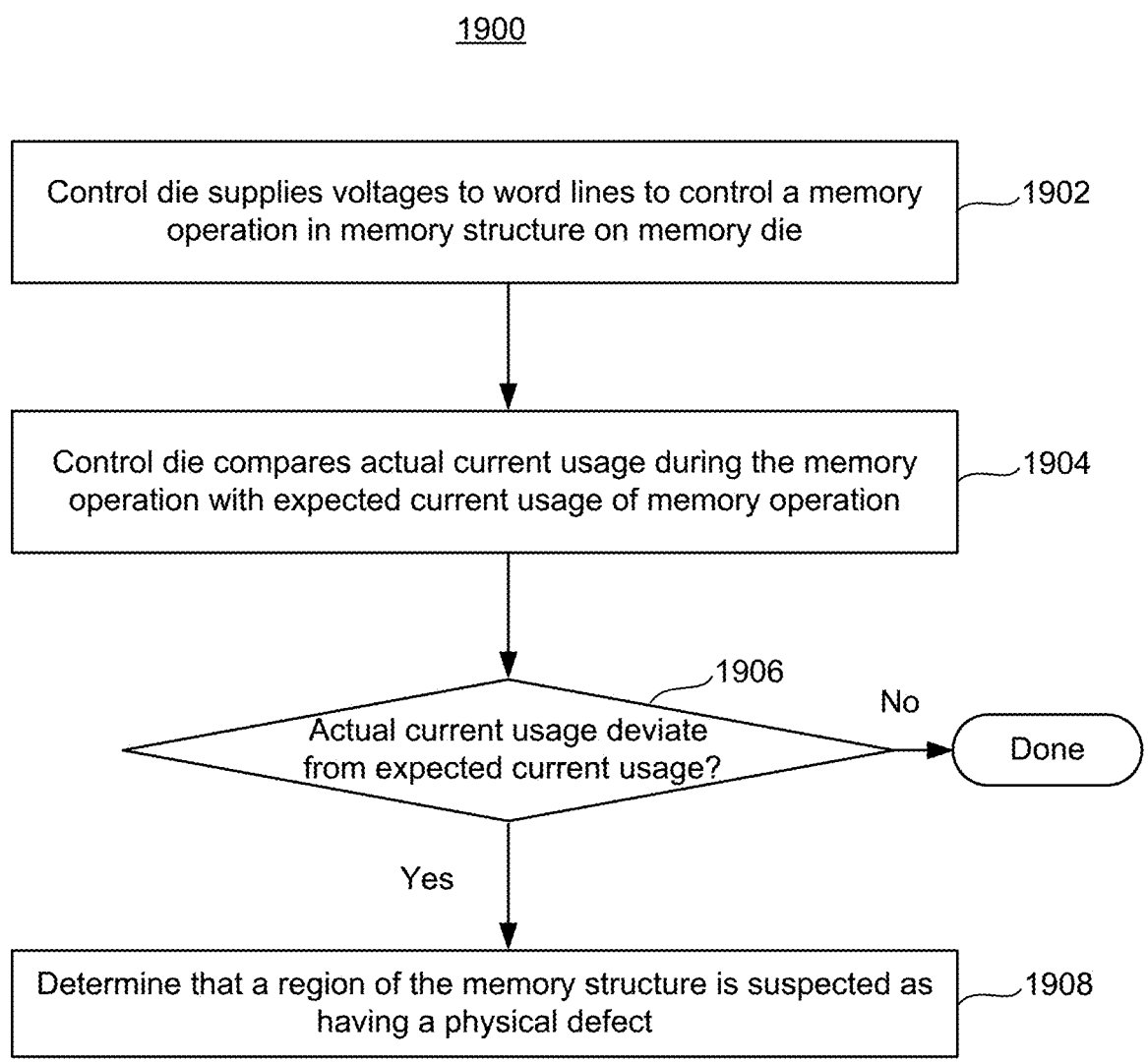
FIG. 19 depicts a flowchart of one embodiment of a process of determining whether a region of a memory structure is suspected as having a physical defect.

In some embodiments, the control die 304 determines whether a region of the memory structure is suspected as having a physical defect. To do so, the control die 304 compares actual current usage during a memory operation with expected current usage during that memory operation. FIG. 19 depicts a flowchart of one embodiment of a process 1900 of determining whether a region of a memory structure 326 is suspected as having a physical defect. In one embodiment, process 1900 is performed by a control die 304.

Step 1902 includes the control die 304 supplying voltages to word lines to control a memory operation in the memory structure 326 on the memory die 302. In one embodiment, the voltages are provided from power supply 316 by way of pathways 352. With reference to FIG. 13A, a word line driver 860 may be used to provide a voltage to a word line 1342 in the memory structure 326. Other word line drivers provide voltages to other word lines the memory structure 326. In one embodiment, the memory operation is a program operation. In one embodiment, the programming process 1400 in FIG. 14 is used in step 1902. In another embodiment, the memory operation is a read operation. In still another embodiment, the memory operation is an erase operation.

Step 1904 includes the control die 304 comparing an actual current usage during the memory operation with an expected current usage for the memory operation. There are many ways in which this comparison can be performed. In some embodiments, multiple current measurements are performed during the memory operation. In some embodiments, each measurement is a peak current during a portion of the memory operation.

Figure 22:
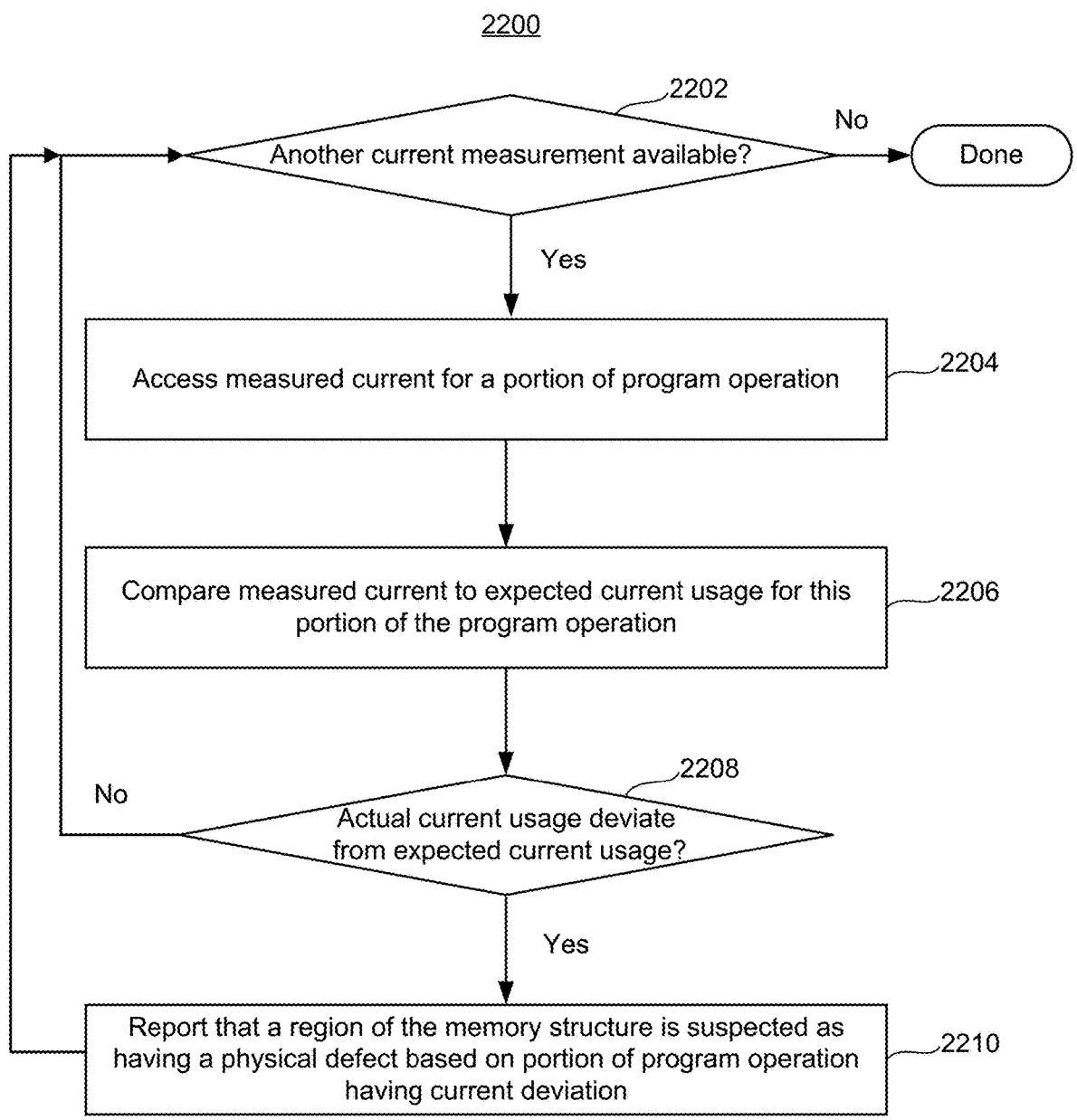
FIG. 22 is a flowchart of one embodiment of a process of determining whether there may be a physical defect in a memory structure based on whether any of multiple actual current usages deviates from an expected current usage.

In one embodiment of step 1904, the control die 304 determines if any of the any of the measured current usages deviate from the expected current usage for the corresponding portion of the memory operation by more than a threshold for the corresponding portion of the program operation. FIG. 22 provides further details for such an embodiment.

Figure 23:
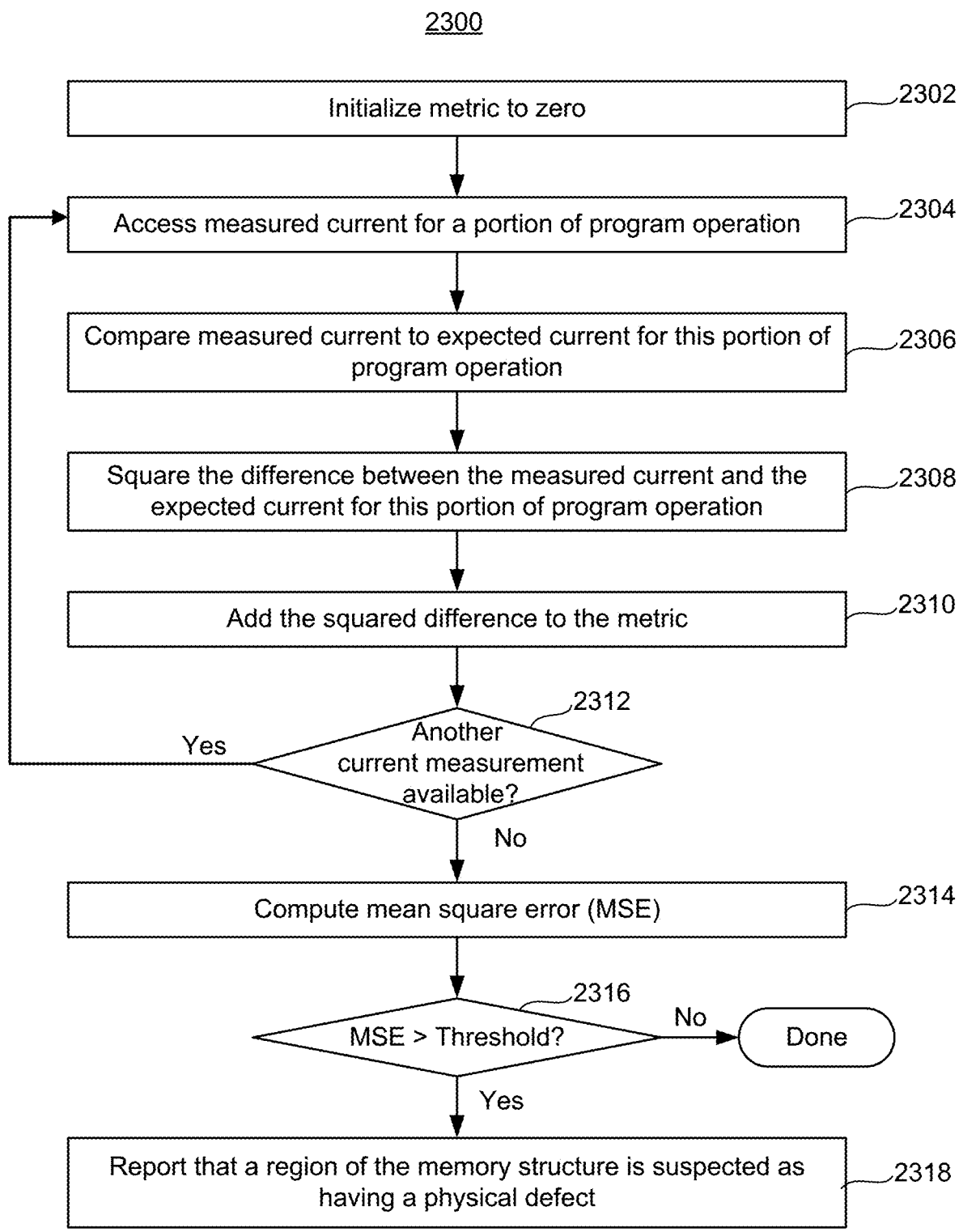
FIG. 23 depicts a flowchart of one embodiment of a process in which the control die performs defect analysis based on a single metric.

In one embodiment of step 1904, the control die 304 forms a single metric based on a difference between each measured current usage and the expected current usage for the corresponding portion of the memory operation. An example of the single metric is a means square error. FIG. 23 provides further details for such an embodiment in which the control die 304 forms a single metric.

Step 1906 is a determination of whether actual current usage deviates from expected current usage by more than a threshold amount. If not, then the process concludes. If the deviation is greater than the threshold, then the control die 304 reaches the determination that a region of the memory structure 326 is suspected as having a physical defect, in step 1908. The region could be the word line for which the memory operation was performed. For example, the region could be the word line that was selected for programming. The region could be the block in which the memory operation was performed. In one embodiment, the region includes one or more bit lines. In one embodiment, the control die 304 reports the region to the memory controller 102. In some embodiments, after the region has been identified, a data integrity check is performed in the region.

Figure 20:
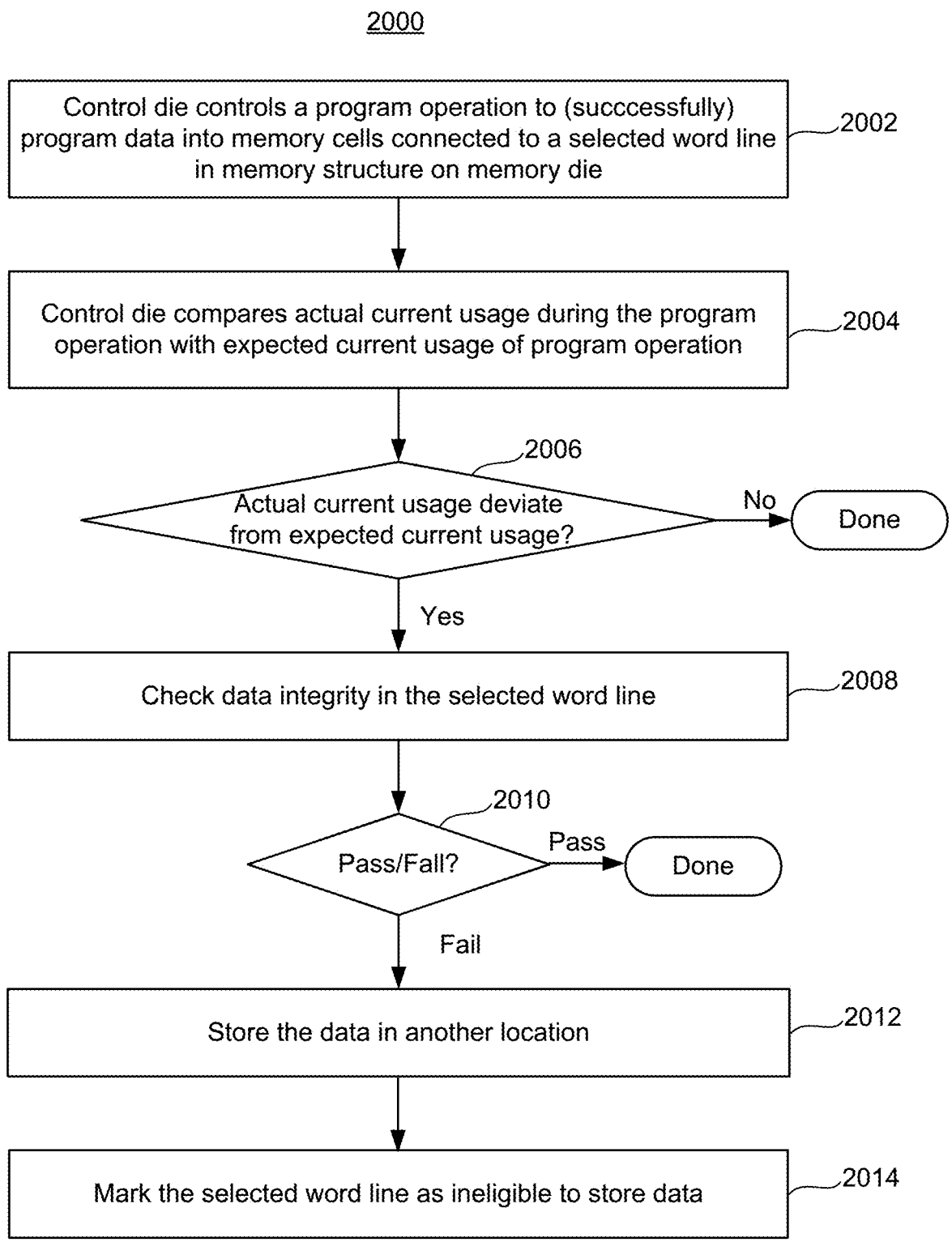
FIG. 20 is a flowchart of one embodiment of a process in which a control die analyzes current usage during a program operation.

In some embodiments, the memory operation for which the control die 304 examines current usage is a program operation. FIG. 20 is a flowchart of one embodiment of a process 2000 in which a control die 304 analyzes current usage during a program operation. Process 2000 may be used to determine if the selected word line is suspected as having a physical defect. Process 2000 provides further details for one embodiment of process 1900 in which the memory operation is a program operation.

Step 2002 includes the control die 304 programming data into non-volatile memory cells connected to the selected word line in the memory structure 326 on the memory die 302. In one embodiment, process 1400 is used to program the data. The data could be programmed at one bit per memory cell, or multiple bits per memory cell. However, data integrity could be a larger issue when data is programmed at multiple bits per memory cell. Note that step 2002 ends with the programming operation ending successfully. For example, the programming process of FIG. 14 ends with a status of pass in step 1414.

Figure 24:
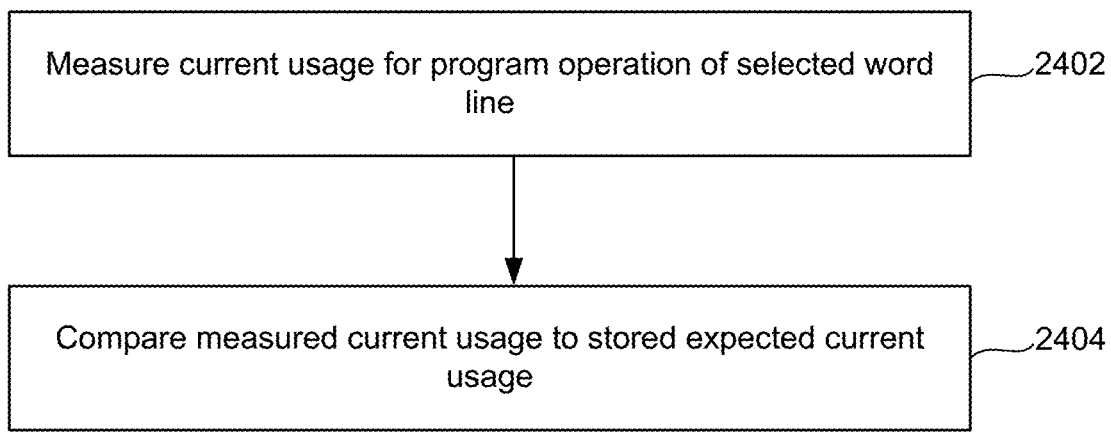
FIG. 24 depicts a flowchart of one embodiment of a process in which measured current usage is compared to as stored expected current usage.
Figure 25:
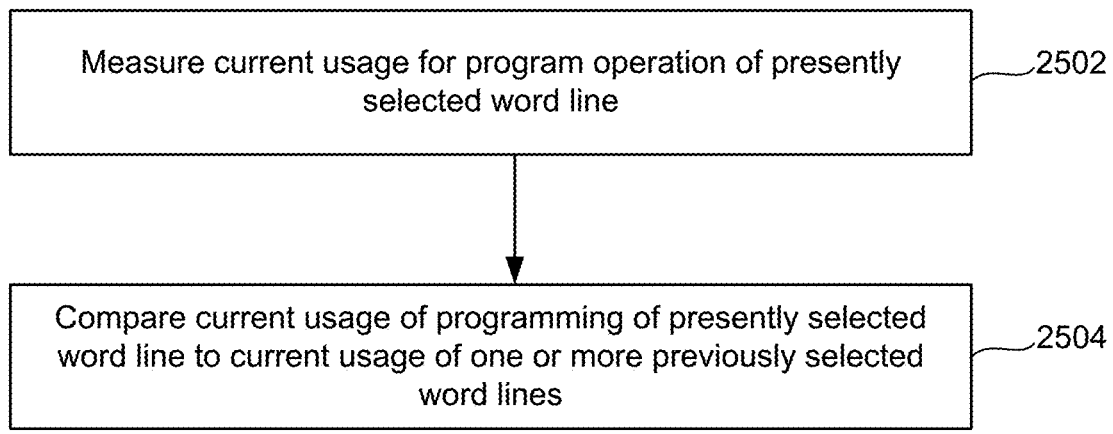
FIG. 25 depicts a flowchart of one embodiment of a process in which measured current usage is compared to the measured current usage of one or more previously selected word line in a block being programmed.

Step 2004 includes the control die 304 comparing actual current usage during the program operation with expected current usage of the program operation. The actual current usage is based on one or more current measurements. In one embodiment, current measurement 330 samples a voltage on resistor 338 in order to measure the current. FIGS. 24 and 25 provide further details of what data can be used for the expected current usage of the program operation. FIG. 24 provides details for an embodiment in which the expected current usage is a stored value. FIG. 25 provides details for an embodiment in which the expected current usage is for other words lines that were recently programmed.

Step 2006 includes a determination of whether the actual current usage deviates from the expected current usage by more than a threshold amount. If not, then the process concludes. FIGS. 23 and 24 provide further details of how to determine whether the actual current usage deviates from the expected current usage by more than a threshold amount. FIG. 23 provides further details for an embodiment in which a separate determination is made for each current measurement. Hence, in one embodiment, the control die 304 determines if any measured current usage deviates from the expected current usage for a corresponding portion of the program operation by more than a threshold. FIG. 24 provides further details for an embodiment in which a single metric is determined for all current measurements, with the single metric being compared to a threshold.

If the actual current usage deviates from the expected current usage by more than the threshold amount, then the integrity of the data in a region of the memory structure is checked. In one embodiment, the data integrity check is performed by the memory controller 102. In one embodiment, the data integrity check is performed by the control die 304. Recall that in process 1900, when the actual current usage deviates from the expected current usage by more than a threshold amount, a determination is made that a region of the memory structure is suspected as having a physical defect. The data integrity check includes reading the data that was just programmed and determining a bit error rate of the data. If the bit error rate is above an allowed bit error rate, then the data integrity check fails.

In the event that the data integrity check fails (step 2010 is fail), then step 2012 is performed. Step 2012 includes storing the data into another location. The other location could be another block on the same memory die 302, or even a different memory die 302. Step 2014 includes marking the selected word line as no longer eligible for storing data. In one embodiment, the entire block in which the selected word line resides is marked as no longer eligible for storing data. In some embodiments, the memory controller 102 stores a list of all blocks, with a status identifier such as "erased," "programmed," or "defective". In effect, the bad (defective) block may be removed from a list of blocks that are eligible to store data. Also note marking the block as ineligible for storing data (or removing the block from a list of block as eligible for storing data), may be considered to be recording that the block has a physical defect.

Figure 21:
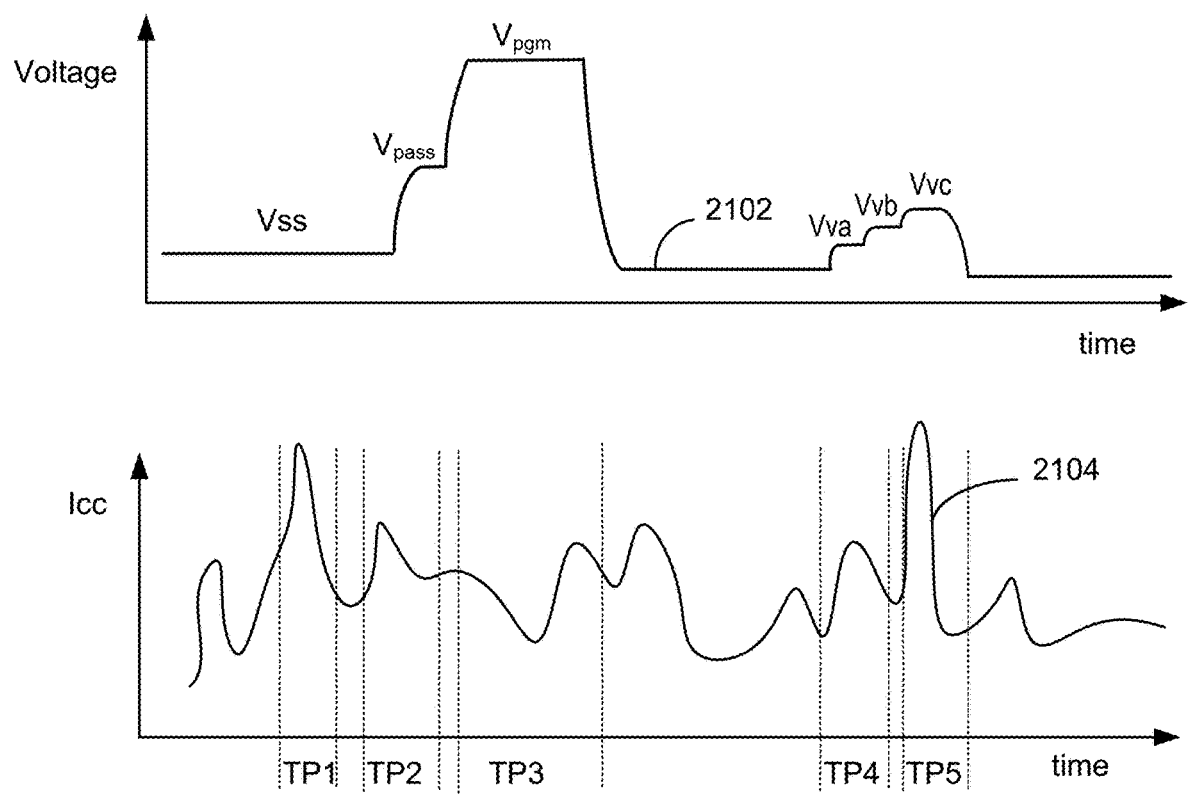
FIG. 21 depicts plots to show an example of current usage for one program loop.

FIG. 21 depicts plots to show an example of current usage for one program loop. Plot 2102 depicts the voltage on the selected word line versus time for one program loop. Plot 2104 depicts current versus time during the program loop. Plot 2104 could represent either the actual current (e.g., actual ICC profile) during the program operation, or an expected current (e.g., expected ICC profile) for the program operation.

Plot 2102 shows that during the program operation the voltage on the selected word line changes several times. Initially, the voltage is at a steady state voltage (Vss). Then, the voltage is increased to a boosting voltage (Vpass), just prior to applying the program voltage (Vpgm) to the selected word line. The voltage Vpass is a boosting voltage that is applied to all word line during programing (see FIG. 17). Note that Vpass and Vpgm are applied to the selected word line during a program phase of a program loop. After applying the program voltage, the memory cells are verified. During the verify operation, one or more verify reference voltages are applied to the selected word line. In FIG. 21, VrA, VrB, and VrC are depicted. These may be VrA, VrB, and VrC depicted in FIG. 15A. Note that it is not required that all verify reference voltages be applied in each program loop. For example, in early program loops, the higher reference voltages (e.g., VvD, VvE, VvF, and VvG) may be skipped.

Plot 2104 is one example of current usage during the program loop. Note, however, that the peaks and valleys will not necessarily occur at the exact times depicted in FIG. 2 (in comparison with reference to the voltage on the selected word line). Also note that there may be some variation in current usage depending on what region of the memory structure is being programmed. For example, current usage could be word line dependent, block dependent, etc.

Note that both the expected current usage and the actual current usage can be quantified at any level of granularity. For example, multiple current samples can be taken during one program loop. FIG. 21 shows several five representative time periods (TP1-TP5) for which a sample is taken. In one embodiment, the current measurement 330 determines peak current consumption during each period (TP1-TP5).

In one embodiment, the sampling periods are strategically selected to capture current usage at times that could indicate a specific type of physical defect. For example, one of the sampling periods may correspond to a time in which bit lines are being charged. Hence, an unusually large or small peak current could indicate a bit line defect. As another example, a sampling period could correspond to a time in which the selected word line is being charged. An unusually large or small peak current could indicate a word line defect.

There are a number of ways in which the expected current usage can be determined. In some embodiments, the expected current usage is determined offline and stored in the memory system 100. In some embodiments, the expected current usage is determined in the field (i.e., after then memory system is provided to the customer) and stored in the memory system 100. In some embodiments, the expected current usage is updated over time. For example, it may be expected that the current usage will change with wear, such that the expected current usage may be re-determined after a number of program/erase cycles.

As noted, the current profile may be characterized at any level of granularity. Thus, the current profile may include a stored value for each of a number of portions of the program operation. This data could be stored in non-volatile memory in, for example, the memory die 302. For example, the stored data may indicate the peak current usage for each of time periods TP1-TP5. Thus, the expected current usage for a set of one or more time periods is one example of an expected current (Icc) profile.

There may be any number of expected current profiles for memory die 302. For example, if different word lines in a block having significant differences in their expected current usage, then there may be multiple current profiles for a block. For example, word lines near the source line might have a different expected current profile from those near the bit line.

A number of techniques may be used to determine the expected current usage. In some embodiments, the expected current usage is based on actual measurements. For example, a program operation is performed on a set of one or more word lines in a block. Then, a single expected current profile is formed for the block based on that measurements for the set. This single expected current profile may be the average for the set of word lines. However, the expected current profile is not required to be determined based on actual measurements. In one embodiment, simulations or modeling is used to determine an expected current profile.

There may be some variation in expected current usage from one program loop to the next due to factors such as differences in the amount of bit line to bit line coupling. The difference in BL-BL coupling arise due to the fact that the bit lines either have a program enable voltage (e.g., 0V) or a program inhibit voltage (e.g., Vdd) applied, in one embodiment. However, from one program loop to the next, a different set of the bit lines have the program enable voltage. Hence, the differences in BL-BL coupling may lead to program loop dependent current usage. In one embodiment, a certain program loop is selected as representative. Hence, the expected current usage could be for a particular program loop.

Although FIG. 21 depicts an example in which current usage for a program operation is discussed, current usage for other operations such as erase and read may also be considered.

There are a number of ways in which the current profile may be used to determine whether there may be a physical defect in the memory structure 326. In one embodiment, the control die 304 compares an actual current usage for each time period with the expected current usage for that time period. If any of the actual current usages deviates from the expected current usage, then the control die 304 reports to the memory controller 102 that a region (e.g., word line, block) of the memory structure 326 is suspected as having a physical defect.

Figure 26:
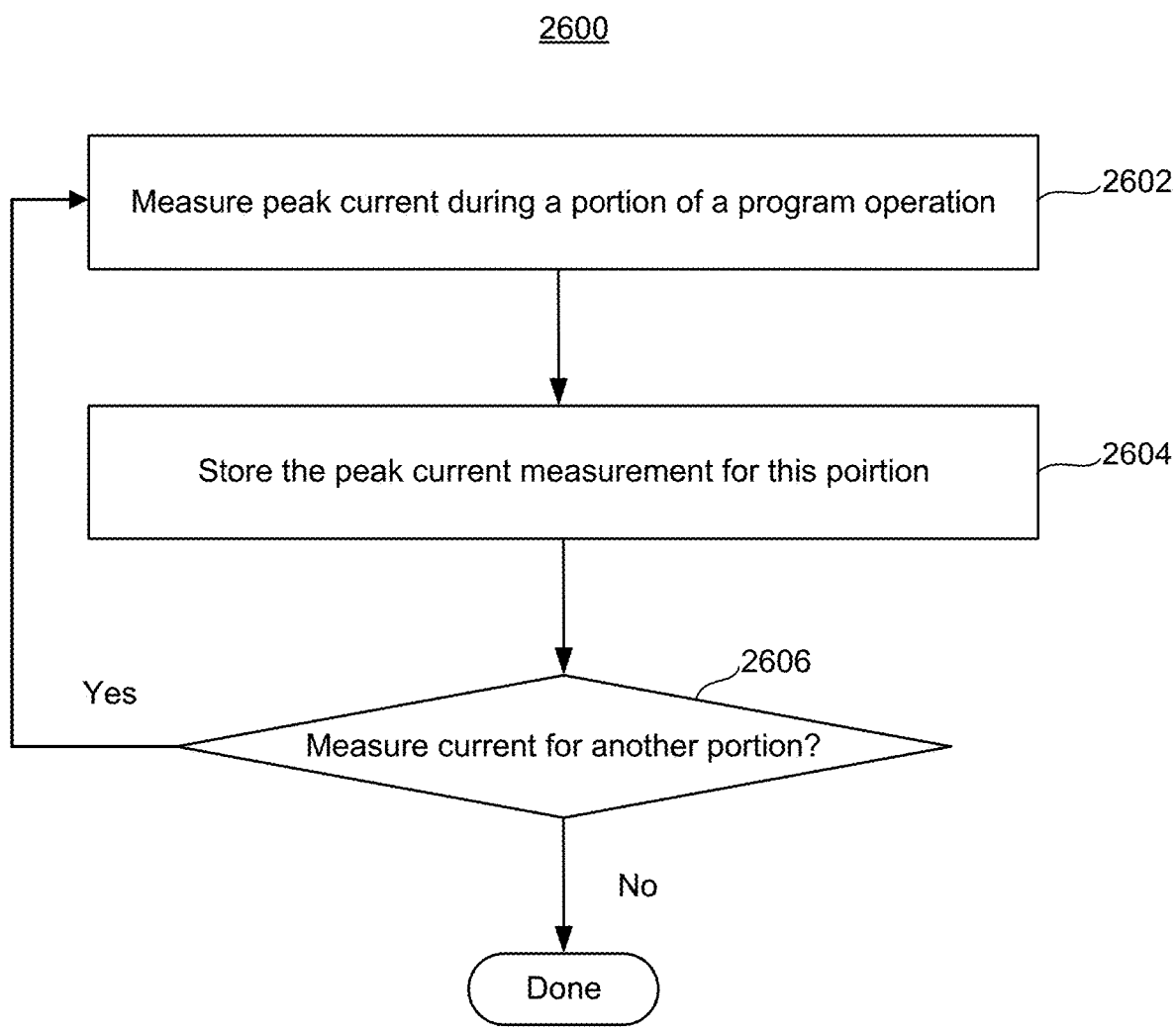
FIG. 26 depicts a flowchart of one embodiment of a process of measuring current during a program operation.

FIG. 22 is a flowchart of one embodiment of a process 2200 of determining whether there may be a physical defect in a memory structure 326 based on whether any of multiple actual current usages deviates from an expected current usage. Process 2200 is performed by the control die 304. It is assumed that the control die 304 has access to current measurements that were made during a program operation. For example, the control die 304 may have made such measurements when controlling the program operation in the memory die 302. In one embodiment, the memory die 302 provides the control die 304 with the current measurements for the different time periods of the program operation. FIG. 26, to be discussed below, provides further details for one embodiment of measuring current usage of a memory operation.

Step 2202 is a determination of whether there are more current measurements. In step 2204, the control die 304 accesses the next current measurement. For the sake of example, the current measurement for time period TP1 is accessed. In step 2206, the control die 304 compares this current measurement to an expected current usage for this time period. Step 2208 is a determination of whether the current measurement for this time period deviates from the expected measurement for this time period by more than an allowed amount for this time period. This test could in effect create an upper threshold and a lower threshold. For example, the control die 304 could determine whether the current measurement for this time period is greater than the upper threshold or less than the lower threshold.

If the current measurement is not outside of this window defined by the two thresholds, then step 2202 is performed again. If the current measurement is outside of this window defined by the two thresholds, then step 2210 is performed. In step 2210, the control die 304 reports to the memory controller 102 that a physical region in the memory structure 326 is suspected as having a physical defect. The region that is reported could be based on when the current measurement was taken. For example, a word line defect may be reported if the current measurement that was abnormal was taken during a time when word lines were being charged. The word line defect might identify the word line that was programmed in process 2200, or a block having the word line that was programmed in process 2200. On the other hand, a bit line defect might be reported if the current measurement that was abnormal was taken during a time when bit lines were being charged. The report of a bit line defect will not necessarily report which bit line is suspected as having a defect.

The control die 304 may also report based on whether the current measurement was higher than expected (e.g., above the upper threshold) or lower than expected (e.g., lower than the lower threshold). This report might indicate this information directly. For example, the control die 304 could send a first digital code that indicates that the current measurement was higher than expected, or a second digital code that indicates that the current measurement was lower than expected. The control die 304 could instead report some conclusion based on the comparison. For example, the control die 304 might report a WL-WL short in the event that the current was higher than expected, or some other defect (e.g., broken word line) in the event that the current was lower than expected.

In one embodiment, after step 2210, step 2202 is performed again to determine whether there are more current measurements. Thus, it is possible to report more than one suspected physical defect in one embodiment of process 2200. However, another option is to conclude the process 2200 after step 2210. Note that if step 2210 is not performed, then the process 2200 concludes without a determination that some region of the memory structure 326 is suspected of having a physical defect. Also note that if the suspected physical defect is reported in step 2210, then a data integrity check may be performed (as in step 2008). However, in one embodiment, if step 2210 is not performed then the data integrity check is not performed, which improves performance of the memory system 100.

As noted above, there are a number of ways in which the current profile 2104 may be used to determine whether there may be a physical defect in the memory structure 326. In one embodiment, the control die 304 determines a single metric, such as a mean square error, for the current measurements. If the single metric deviates too far from a target, then the control die 304 reports to the memory controller 102 that a region (e.g., word line, block) of the memory structure 326 is suspected as having a physical defect. FIG. 23 depicts a flowchart of one embodiment of a process 2300 in which the control die 304 performs defect analysis based on a single metric.

Step 2302 includes initializing a metric to zero. This metric will be adjusted during process 2300, based on deviations of measured current usage from expected current usage.

Step 2304 includes accessing a measured current sample for a portion of a program operation. For example, a peak current measurement for period TP1 (see FIG. 2) may be accessed. Step 2306 includes comparing the measured current for this period to an expected current for this period. Step 2306 may be similar to step 2206 in process 2200.

Step 2308 includes squaring the difference between the measured current and the expected current. A different mathematical operation other than squaring could be used in step 2308. For example, the absolute value of the difference could be formed.

Step 2310 includes adding the squared difference (from step 2308) for this time period to the metric. Hence, step 2310 computes a sum of the squared differences for each time period.

Step 2312 is a determination of whether there are more current measurements available for the program operation. Recall that the current profile 2104 in FIG. 21 allows for any number of measurements. In the plot 2104 in FIG. 21 there are five current measurements, but any number of measurements can be used. In some embodiments, measurements for a single program loop are sufficient. However, measurements for more than one program loop could be used in process 2300.

If there are more current measurements, then control passes to step 2304. Otherwise, control passes to step 2314 to process the next current measurement. In step 2314 the mean square error (MSE) is computed by dividing the metric by the number of measurements used in process 2300. Step 2316 includes a determination of whether the MSE is greater than a threshold. If not, then the process concludes. Note that the process concludes without a determination that some region of the memory structure 326 is suspected of having a physical defect. If the MSE is greater than the threshold, then in step 2318 the control die 304 reports (to the memory controller 102) that a region of the memory structure is suspected as having a physical defect. If the suspected physical defect is reported in step 2318, then a data integrity check may be performed (as in step 2008). However, in one embodiment, if step 2318 is not performed, then the data integrity check is not performed, which improves performance of the memory system 100. Many variations of process 2300 are possible. For example, step 2314 could be skipped with a suitable adjustment to the threshold in step 2316.

In various processes described herein, the measured current usage during a memory operation is compared to an expected current usage. There are a number of ways in which the expected current usage can be determined. In some embodiments, the control die 304 has access to one or more stored expected current profiles, which each contain values for expected current usage. There could be different expected current profiles to account for different expected current usage when performing a memory operation (e.g., programming) in different regions of the memory structure. For example, the expected current profile could depend on the location of the selected word line. However, note that the same expected current profile could be used for many, if not all, word lines in the memory structure.

FIG. 24 depicts a flowchart of one embodiment of a process 2400 in which measured current usage is compared to a stored expected current usage. Process 2400 is one embodiment of step 1904 of process 1900. Step 2402 includes measuring current usage for a program operation of a selected word line. Step 2404 includes comparing the measured current usage to stored expected current usage.

In some embodiments, the control die 304 compares the measured current usage of a presently selected word line with the measured current usage of one or more previously selected word line in a block being programmed. FIG. 25 depicts a flowchart of one embodiment of a process 2500 in which measured current usage is compared to the measured current usage of one or more previously selected word line in a block being programmed. Process 2500 is one embodiment of step 1904 of process 1900. Step 2502 includes measuring current usage for a program operation of a selected word line. Step 2504 includes comparing the measured current usage to the measured current usage of one or more previously selected word line in a block being programmed. The measured current usage of the one or more previously selected word line in the block being programmed may be an average current usage for those previously selected word lines. For example, each time a word line is programmed, the control die 304 may store the peak current usage for each of a number of portions of the program operation (e.g., TP1-TP5 in FIG. 21). Then, the control die 304 may form an average peak current usage for each portion of the program operation (e.g., TP1-TP5 in FIG. 21). Hence, the measured current usage will be compared to one for which environmental conditions (e.g., temperature) were similar. Also, the measured current usage will be compared to measurements from the same region (e.g., block) of the memory structure. Hence, factors such as wear (e.g., program/erase) cycles will be the same in the comparison. An alternative is to save current measurements from a different block, and use those in step 2504.

There are many ways in which the current can be measured during the memory operation. FIG. 26 depicts a flowchart of one embodiment of a process 2600 of measuring current during a program operation. Process 2600 may be used in steps 2402 and 2502. Process 2600 may be used to measure and store current usage, such that the stored current usage may be used in any of processes 1900, 2000, 2200, or 2300.

Step 2602 includes measuring peak current usage during a portion of a memory operation. In one embodiment, the portion is identified by a sub-clock of the memory operation. That is, the memory operation is divided into a number of sub-clocks. A sub-clock is a period of time. In one embodiment, the sub-clock is based on the times in which a voltage is changed on a word line, select line, bit line, etc. For example, some of the sub-clocks could be based on the times t0-t8 in FIG. 17. In one embedment, a sub-clock is defined as the period between two immediate adjacent times. For example, the period between t4 and t5 is one example of a sub-clock. In some embodiments, the processor 312 (or a state machine) keeps track of the sub-clocks in order to control the voltages to the memory structure 326. In one embodiment, the current measurement 330 samples the current in accordance with the sub-clocks. For example, the current might be sampled between time t4 and t5 in FIG. 17. Also note that the various periods T1-T5 in FIG. 21 may correspond to such sub-clocks. In one embodiment, the current is measured based on a voltage sampled from resistor 338. During the memory operation, a current that is proportional to ICC that is drawn by performing the memory operation may be mirrored to the resistor 338. Hence, the voltage on resistor 338 is proportional to ICC. In one embodiment, the resistor 338 is used as a shunt resistor.

Step 2604 includes storing the peak current measurement for this portion of the memory operation. The peak current measurement could be stored in, for example, storage region 318 and/or memory storage region 336. The process repeats if there is to be a current measurement for another portion of the memory operation (step 2606=yes).

In view of the above, it can be seen that a first embodiment includes an apparatus comprising An apparatus comprising a memory semiconductor die comprising a memory structure having non-volatile memory cells, and a control semiconductor die semiconductor die connected to the memory semiconductor die. The control semiconductor die comprises one or more control circuits. The one or more control circuits are configured to supply voltages to the memory structure to control a memory operation in the memory semiconductor die. The one or more control circuits are configured to compare an actual current usage for the memory operation to an expected current usage for the memory operation. The one or more control circuits are configured to determine that a region in the memory structure is suspected as having a physical defect if the actual current usage deviates from the expected current usage by more than a threshold.

In a second embodiment, and in furtherance of the first embodiment, the apparatus further comprises logic configured to check integrity of data that was successfully programmed in the region in response to the one or more control circuits determining that the region is suspected as having a physical defect.

In a third embodiment, and in furtherance of the second embodiment, the apparatus further comprises a memory controller in communication with the control semiconductor die. The memory controller comprises the logic configured to check integrity of the data in the region. The one or more control circuits of the control semiconductor die are further configured to report the region of the memory structure to the memory controller.

In a fourth embodiment, and in furtherance of the second embodiment, the one or more control circuits of the control semiconductor die comprise the logic configured to check integrity of the data in the region.

In a fifth embodiment, and in furtherance of any of the first to fourth embodiments, the actual current usage comprises a measured current usage for each of a plurality of different portions of the memory operation, and the expected current usage comprises an expected current usage for each of the plurality of different portions of the memory operation. The one or more control circuits of the control semiconductor die are configured to determine whether the actual current usage deviates from the expected current usage by more than a threshold by forming a single metric based on a difference between each measured current usage and the expected current usage for a corresponding portion of the memory operation, and comparing the single metric to the threshold.

In a sixth embodiment, and in furtherance of any of the first to fifth embodiments, the actual current usage comprises a measured current usage for each of a plurality of different portions of the memory operation, and the expected current usage comprises an expected current usage for each of the plurality of different portions of the memory operation. The one or more control circuits of the control semiconductor die are configured to determine that the region in the memory structure is suspected as having a physical defect in response to any measured current usage deviating from the expected current usage for a corresponding portion of the memory operation by more than a threshold for the portion of the memory operation.

In a seventh embodiment, and in furtherance of the sixth embodiment, the one or more control circuits of the control semiconductor die are further configured to determine a type of physical defect in the region of the memory structure based on which portion of the memory operation has an actual current usage that deviates from the expected current usage by more than the threshold.

In an eighth embodiment, and in furtherance of any of the first to seventh embodiments, the memory structure comprises word lines connected to the memory cells and bit lines associated with the memory cells. The one or more control circuits of the control semiconductor die are further configured to determine that the region is a word line in response to the actual current usage for a first portion of the memory operation deviating from a first expected current usage. The one or more control circuits of the control semiconductor die are further configured determine that the region comprises one or more bit lines in response to the actual current usage for a second portion of the memory operation deviating from a second expected current usage.

In a ninth embodiment, and in furtherance of any of the first to eighth embodiments, the memory operation is a first memory operation, and the expected current usage comprises an actual current usage for one or more second memory operations performed in the memory structure of the memory semiconductor die. The one or more control circuits of the control semiconductor die are further configured to determine that the region in the memory structure is suspected as having a physical defect in response to the actual current usage for the first memory operation deviating from the actual current usage for the one or more second memory operations by more than the threshold.

In a tenth embodiment, and in furtherance of any of the first to ninth embodiments, the expected current usage comprises a stored value for the region of the memory structure, and the one or more control circuits of the control semiconductor die are further configured to determine that the region in the memory structure is suspected as having a physical defect in response to the actual current usage for the memory operation deviating from the stored value by more than the threshold.

In an eleventh embodiment, and in furtherance of any of the first to tenth embodiments, the actual current usage is a measured peak current usage, and the expected current usage is an expected peak current usage.

In a twelfth embodiment, and in furtherance of any of the first to eleventh embodiments, the memory operation is a program operation.

Another embodiment includes a method of operating non-volatile storage. The method comprises controlling, by one or more control circuits on a control semiconductor die, a program operation in a memory semiconductor die, wherein the memory semiconductor die comprises a memory structure having non-volatile memory cells. Controlling the program operation includes the one or more control circuits providing a program voltage to a selected word line in the memory structure. The method also includes determining an actual ICC profile for the program operation as the program operation is being controlled by the control semiconductor die. The method also includes determining that the program operation has successfully programmed data into memory cells connected to the selected word line. The method also includes comparing, by the one or more control circuits on the control semiconductor die, the actual ICC profile to an expected ICC profile for the program operation. The method also includes checking integrity of the data that was successfully programmed into the memory cells connected to the selected word line in response to the actual ICC profile deviating from the expected ICC profile by more than a threshold amount.

Another embodiment includes a non-volatile memory system. The non-volatile memory system comprises an integrated memory assembly comprising a control semiconductor die bonded to a memory semiconductor die. The memory semiconductor die comprises a memory structure comprising word lines and non-volatile memory cells connected to the word lines. The non-volatile memory system also comprises a memory controller in communication with the integrated memory assembly. The control semiconductor die comprises one or more control circuits configured to control a program operation to store data in memory cells connected to a selected word line in the memory structure on the memory semiconductor die; and identify the selected word line to the memory controller in response to measured peak current usage by the integrated memory assembly for one or more portions of the program operation deviating from expected peak current usage by more than a threshold. The memory controller is configured to check integrity of the data that was stored in the memory cells connected to the selected word line in response to the control die identifying the selected word line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus comprising:
   a memory semiconductor die comprising a memory structure having non-volatile memory cells; and
   a control semiconductor die connected to the memory semiconductor die, wherein the control semiconductor die comprises one or more control circuits configured to:
   supply voltages to the memory structure to control a program operation in the memory semiconductor die;
   compare an actual current usage for the program operation to an expected current usage for the program operation; and
   identify memory cells in the memory structure if the actual current usage deviates from the expected current usage by more than a threshold; and
   logic configured to check integrity of data that was successfully programmed in the identified memory cells by the program operation in response to the one or more control circuits identifying the memory cells.

2. The apparatus of claim 1, further comprising a memory controller in communication with the control semiconductor die, wherein:

the memory controller comprises the logic configured to check integrity of the data in the identified memory cells; and the one or more control circuits of the control semiconductor die are further configured to report the identified memory cells to the memory controller.

3. The apparatus of claim 1, wherein:

the one or more control circuits of the control semiconductor die comprise the logic configured to check integrity of the data in the identified memory cells.

4. The apparatus of claim 1, wherein:

the actual current usage comprises a measured current usage for each of a plurality of different portions of the program operation;

the expected current usage comprises an expected current usage for each of the plurality of different portions of the program operation; and the one or more control circuits of the control semiconductor die are configured to determine whether the actual current usage deviates from the expected current usage by more than a threshold by:

forming a single metric based on a difference between each measured current usage and the expected current usage for a corresponding portion of the program operation; and comparing the single metric to the threshold.

5. The apparatus of claim 1, wherein:

the actual current usage comprises a measured current usage for each of a plurality of different portions of the program operation;

the expected current usage comprises an expected current usage for each of the plurality of different portions of the program operation; and the one or more control circuits of the control semiconductor die are configured to determine that a region in the memory structure is suspected as having a physical defect in response to any measured current usage deviating from the expected current usage for a corresponding portion of the program operation by more than a threshold for the portion of the program operation.

6. The apparatus of claim 5, wherein the one or more control circuits of the control semiconductor die are further configured to:

determine a type of physical defect in the region of the memory structure based on which portion of the program operation has an actual current usage that deviates from the expected current usage by more than the threshold.

7. The apparatus of claim 5, wherein the memory structure comprises word lines connected to the memory cells and bit lines associated with the memory cells, wherein the one or more control circuits of the control semiconductor die are further configured to:

determine that the region is a word line in response to the actual current usage for a first portion of the program operation deviating from a first expected current usage; and determine that the region comprises one or more bit lines in response to the actual current usage for a second portion of the program operation deviating from a second expected current usage.

8. The apparatus of claim 1, wherein:

the program operation is a first program operation;

the expected current usage comprises an actual current usage for one or more second program operations performed in the memory structure of the memory semiconductor die; and the one or more control circuits of the control semiconductor die are further configured to identify the memory cells in response to the actual current usage for the first program operation deviating from the actual current usage for the one or more second program operations by more than the threshold.

9. The apparatus of claim 1, wherein:

the expected current usage comprises a stored value for the identified memory cells; and the one or more control circuits of the control semiconductor die are further configured to identify the memory cells in response to the actual current usage for the program operation deviating from the stored value by more than the threshold.

10. The apparatus of claim 1, wherein:

the actual current usage is a measured peak current usage; and the expected current usage is an expected peak current usage.

11. The apparatus of claim 1, wherein the one or more control circuits are configured to determine that a region in the memory structure is suspected as having a physical defect if the actual current usage for the program operation deviates from the expected current usage for the program operation by more than a threshold.

12. The apparatus of claim 1, wherein the one or more control circuits are configured to mark the identified memory cells in which the data was successfully programmed as ineligible to store data in response to the data that was successfully programmed in the identified memory cells failing the integrity check.

13. A method of operating non-volatile storage, the method comprising:

controlling, by one or more control circuits on a control semiconductor die, a program operation in a memory semiconductor die, wherein the memory semiconductor die comprises a memory structure having non-volatile memory cells, wherein controlling the program operation includes the one or more control circuits providing a program voltage to a selected word line in the memory structure;

determining an actual ICC profile for the program operation as the program operation is being controlled by the control semiconductor die;

determining that the program operation has successfully programmed data into memory cells connected to the selected word line;

comparing, by the one or more control circuits on the control semiconductor die, the actual ICC profile to an expected ICC profile for the program operation; and checking integrity of the data that was successfully programmed into the memory cells connected to the selected word line in response to the actual ICC profile deviating from the expected ICC profile by more than a threshold amount.

14. The method of claim 13, further comprising:

reporting, by the control semiconductor die to a memory controller, that the selected word line is suspected as having a physical defect, wherein checking the integrity of the data is performed by the memory controller in response to the report.

15. The method of claim 13, wherein determining the actual ICC profile for the program operation comprises:
- providing a current that is proportional to an ICC current that is drawn by performing the program operation to a shunt resistor; and
- sampling a voltage on the shunt resistor at a plurality of different times during the program operation.

16. A non-volatile memory system, comprising:
- an integrated memory assembly comprising a control semiconductor die bonded to a memory semiconductor die, wherein the memory semiconductor die comprises a memory structure comprising word lines and non-volatile memory cells connected to the word lines; and
- a memory controller in communication with the integrated memory assembly;
- wherein the control semiconductor die comprises:
  - means for controlling a program operation to store data in memory cells connected to a selected word line in the memory structure on the memory semiconductor die; and
  - means for identifying a suspected type of physical defect in a region of the memory structure to the memory controller based on which portion of the program operation has a measured peak current usage by the integrated memory assembly deviating from expected peak current usage by more than a threshold;
- wherein the memory controller is configured to check integrity of the data that was stored in the memory cells connected to the selected word line in response to the control die identifying the suspected type of physical defect.

17. The non-volatile memory system of claim 16, wherein:
- the measured peak current usage comprises a measured peak current usage for each of a plurality of different portions of the program operation;
- the expected peak current usage comprises an expected peak current usage for each of the plurality of different portions of the program operation; and
- the means for identifying a suspected type of physical defect to the memory controller is configured to identify the selected word line to the memory controller in response to any of the measured peak current usages deviating from the expected peak current usage for a corresponding portion of the program operation by more than a threshold for the corresponding portion of the program operation.

18. The non-volatile memory system of claim 16, wherein:
- the measured peak current usage comprises a measured peak current usage for each of a plurality of different portions of the program operation;
- the expected peak current usage comprises an expected peak current usage for each of the plurality of different portions of the program operation; and
- the means for identifying a suspected type of physical defect to the memory controller is configured to determine whether the measured peak current usage deviates from the expected peak current usage by more than a threshold based on determining a sum of squares of differences between each measured peak current usage and the expected peak current usage for a corresponding portion of the program operation.

19. The non-volatile memory system of claim 16, wherein the memory controller is further configured to:
- check integrity of the data by determining a bit error rate of data read from the memory cells connected to the selected word line; and
- mark the selected word line as ineligible to store data in response to the bit error rate being greater than an allowed amount.

20. The non-volatile memory system of claim 16, further comprising a shunt resistor, wherein the integrated memory assembly comprises means for:
- providing a current that is proportional to an ICC current to the shunt resistor;
- sampling a voltage on the shunt resistor at a plurality of different times during the program operation; and
- determining the measured peak current usage during the one or more of the portions of the program operation based on the sampled voltages.

* * * * *